US012211585B2

(12) United States Patent
Gopinath et al.

(10) Patent No.: US 12,211,585 B2
(45) Date of Patent: *Jan. 28, 2025

(54) PARTITIONED MEMORY ARCHITECTURE WITH SINGLE RESISTOR MEMORY ELEMENTS FOR IN-MEMORY SERIAL PROCESSING

(71) Applicant: GlobalFoundries U.S. Inc., Malta, NY (US)

(72) Inventors: Venkatesh P. Gopinath, Fremont, CA (US); Pirooz Parvarandeh, Los Altos Hills, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 224 days.

This patent is subject to a terminal disclaimer.

(21) Appl. No.: 18/045,520

(22) Filed: Oct. 11, 2022

(65) Prior Publication Data
US 2024/0119977 A1    Apr. 11, 2024

(51) Int. Cl.
G11C 7/10 (2006.01)
G11C 7/06 (2006.01)
G11C 7/12 (2006.01)

(52) U.S. Cl.
CPC ............ *G11C 7/1096* (2013.01); *G11C 7/067* (2013.01); *G11C 7/1063* (2013.01); *G11C 7/12* (2013.01)

(58) Field of Classification Search
CPC ..... G11C 7/1096; G11C 7/067; G11C 7/1063; G11C 7/12
See application file for complete search history.

(56) References Cited

U.S. PATENT DOCUMENTS

| 4,906,865 A | 3/1990 | Holler |
| 7,830,705 B2 | 11/2010 | Jeong |

(Continued)

FOREIGN PATENT DOCUMENTS

| CN | 113139641 A | 7/2021 |
| DE | 102020126502 A1 | 5/2021 |

(Continued)

OTHER PUBLICATIONS

U.S. Appl. No. 18/045,524, Office Action dated Jun. 11, 2024, 17 pages.

(Continued)

*Primary Examiner* — Han Yang
(74) *Attorney, Agent, or Firm* — David Cain; Hoffman Warnick LLC

(57) ABSTRACT

A structure for in-memory serial processing includes a memory bank array. Each bank includes memory elements connected between input nodes and a bitline. Each memory element includes a programmable resistor with an input connected to an input node and an output connected to the bitline. Each bank includes a feedback buffer connected to the bitline and an output node. Output nodes of banks in the same column are connected to the same column interconnect line. The initial bank in each row includes amplifiers connected between the input nodes and the memory elements, respectively. Outputs of these amplifiers are also connected by row interconnect lines to memory elements in downstream banks in the same row. Optionally, voltage buffers are connected to row interconnect lines and integrated into at least some banks. The amplifiers, feedback buffers, and voltage buffers minimize local IR drops and thereby processing errors.

20 Claims, 20 Drawing Sheets

(56) References Cited

U.S. PATENT DOCUMENTS

| | | |
|---|---|---|
| 9,450,021 B1 | 9/2016 | Lee |
| 9,934,838 B1 | 4/2018 | Han et al. |
| 10,290,679 B1 | 5/2019 | Bhushan et al. |
| 11,335,401 B1 | 5/2022 | Huang et al. |
| 11,393,512 B2 | 7/2022 | Lai et al. |
| 2006/0067106 A1* | 3/2006 | Mori ............... G11C 13/0069 365/148 |
| 2006/0126413 A1* | 6/2006 | Liaw ............... G11C 13/0011 365/210.15 |
| 2014/0050020 A1 | 2/2014 | Lee et al. |
| 2014/0169068 A1 | 6/2014 | Lee et al. |
| 2016/0027488 A1 | 1/2016 | Kim |
| 2016/0372187 A1 | 12/2016 | Papandreou et al. |
| 2018/0260696 A1 | 9/2018 | Suda et al. |
| 2018/0268898 A1* | 9/2018 | Suzuki ............... G11C 13/0023 |
| 2019/0147330 A1 | 5/2019 | Otsuka et al. |
| 2019/0236445 A1 | 8/2019 | Das et al. |
| 2019/0392896 A1 | 12/2019 | Chung |
| 2020/0356848 A1 | 11/2020 | Lesso et al. |
| 2021/0064379 A1 | 3/2021 | Mattina et al. |
| 2021/0263683 A1 | 8/2021 | Bayat et al. |
| 2023/0066707 A1 | 3/2023 | Chuang |
| 2023/0326524 A1* | 10/2023 | Pasotti ............... G11C 7/1006 365/163 |
| 2023/0326525 A1 | 10/2023 | Akarvardar et al. |
| 2024/0038300 A1 | 2/2024 | Kumar et al. |

FOREIGN PATENT DOCUMENTS

| | | |
|---|---|---|
| WO | 2018069716 A1 | 4/2018 |
| WO | 2020243300 A1 | 12/2020 |

OTHER PUBLICATIONS

U.S. Appl. No. 18/045,479, Notice of Allowance dated Jun. 28, 2024, 28 pages.

Correll et al., "A Fully Integrated Reprogrammable CMOS-RRAM Compute-in-Memory Coprocessor for Neuromorphic Applications," IEEE Journal on Exploratory Solid-State Computational Devices and Circuits, published May 4, 2020, pp. 36-44.

European Search Report for EP Application No. 23187989.1-1211 dated Mar. 5, 2024, 9 pages, (corresponding to U.S. Appl. No. 18/045,545).

Chang et al., "AI hardware acceleration with analog memory: Microarchitectures for low energy at high speed," IBM J. Res. & Dev. vol. 63, No. 6, Paper 8, Nov./Dec. 2019, 14 pages.

European Search Report for EP Application No. 23187147.6-1211 dated Mar. 6, 2024, 11 pages, (corresponding to U.S. Appl. No. 18/045,524.).

European Search Report for EP Application No. 23187993.3-1211 dated Mar. 13, 2024, 9 pages, (corresponding to U.S. Appl. No. 18/045,479).

Aziza et al., "Multi-Level Control of Resistive RAM (RRAM) Using a Write Termination to Achieve 4 Bits/Cell in High Resistance State," Electronics 2021, 10, 2222, 15 pages.

Dong et al., "Design Considerations of Large-Scale RRAM-Based Convolutional Neural Networks with Transfer Learning," retrieved from https://www.researchgate.net/publication/343982199, uploaded Aug. 30, 2020, 7 pages.

Fick et al., "Analog In-Memory Subthreshold Deep Neural Network Accelerator," IEEE 2017, 4 pages.

Giannoula et al., "SparseP: Towards Efficient Sparse Matrix Vector Multiplication on Real Processing-In-Memory Systems," arXiv:2201.05072v4 [cs.AR], May 23, 2022, 60 pages.

Gu et al., "Technilogical Exploration of RRAM Crossbar Array for Matrix-Vector Multiplication," IEEE 2015, pp. 106-111.

Jaiswal et al., "8T SRAM Cell as a Multi-bit Dot Product Engine for Beyond von-Neumann Computing," IEEE Oct. 16, 2018, 10 pages.

Qiao et al., "AtomLayer: A universal ReRAM-based CNN accelerator with atomic layer computation," In Proceedings of the 55th Annual Design Automation Conference 6 pages.

Sahay et al., A 2T-1R Cell Array with High Dynamic Range for Mismatch-Robust and Efficient Neurocomputing, IEEE 2020, 4 pages.

Shafiee et al., "ISAAC: A convolutional neural network accelerator with in-situ analog arithmetic in crossbars," ACM SIGARCH Computer Architecture News, 44(3), pp. 14-26.

Stathopoulos et al., "Multibit memory operation of metal-oxide bi-layer memristors," Scientific Reports 7.1 (2017), 7 pages.

Xue et al., "Embedded 1-Mb ReRAM-Based Computing-in-Memory Macro With Multibit Input and weight for CNN-Baed AI Edge Processors," IEEE Journal of Solid-State Circuits, vol. 55, No. 1, Jan. 2020, pp. 203-215.

Yao et al., "Fully hardware-implemented memristor convolutional neural network," Nature, vol. 577, Jan. 30, 2020, pp. 641-662.

Yin et al., "Monolithically Integrated RRAM-and CMOS-Based In-Memory Computing Optimizations for Efficient Deep Learning," IEEE Mirco 2019, pp. 54-63.

U.S. Appl. No. 18/045,545, Office Action dated Jun. 21, 2024, 23 pages.

U.S. Appl. No. 18/045,524, Response to Office Action filed Jun. 24, 2024, 11 pages.

U.S. Appl. No. 18/045,529, Notice of Allowance dated Jul. 31, 2024, 12 pages.

EP Patent Application Serial No. 23187997.4-1211, Search Report dated Jul. 24, 2024, 9 pages.

U.S. Appl. No. 18/045,545, Response to Office Action filed Jul. 15, 2024, 17 pages.

* cited by examiner

PARTITIONED MEMORY ARCHITECTURE WITH SINGLE RESISTOR MEMORY ELEMENTS FOR IN-MEMORY SERIAL PROCESSING

BACKGROUND

Field of the Invention

The present invention relates to in-memory processing and, more particularly, to embodiments of a memory architecture for in-memory processing.

Description of Related Art

Various processing applications (e.g., image processing applications, voice processing applications, or other machine learning (ML) or artificial intelligence (AI) processing) employ cognitive computing and, particularly, neural networks (NNs) (e.g., for recognition and classification). Those skilled in the art will recognize that a NN is a deep learning algorithm where approximately 90% of the computations performed in the algorithm are multiply and accumulate (MAC) operations. For example, in a NN for image processing, the various MAC operations are used to compute the products of inputs (also referred to as activations), which are identified intensity values of the pixels in a receptive field, and weights in a filter matrix (also referred to as a kernel) of the same size as the receptive field, and to further compute the sum of the products. These computations are referred to as dot product computations. Historically, software solutions were employed to compute NNs. Recently, processors with hardware-implemented NN's and, particularly, with memory-implemented NN's have been developed to increase processing speed. However, such memory implemented NNs typically require large memory cell arrays (i.e., arrays with a large number of rows and columns of memory cells) to implement and, as the complexity of such NNs increases, so does the size of the arrays. Unfortunately, such an increase in array size can result in an increase in local voltage ("IR") drops across the array, thereby leading to processing errors.

SUMMARY

An embodiment of a structure disclosed herein can include an array of memory banks arranged in rows and columns. Each memory bank can include multiple input nodes, an output node, and a bitline. Each memory bank can further include multiple memory elements one for each input node. The memory elements can be arranged in a single column with multiple rows. Each memory element can include a programmable resistor connected between a corresponding input node and the bitline. Each memory bank can further include a feedback buffer circuit, which is connected to one end of the bitline and further to the output node for the memory bank.

Another embodiment of a structure disclosed herein can include an array of memory banks arranged in rows and columns. Each memory bank can include multiple input nodes, an output node, and a bitline. Each memory bank can further include multiple memory elements, one for each input node. The memory elements in each memory bank can be arranged in a single column with multiple rows. Each memory element can include a programmable resistor connected between a corresponding input node and the bitline. Each memory bank can further include a feedback buffer circuit, which is connected to a bias node at one end of the bitline and further to the output node for the memory bank. The structure can further include column interconnect lines for the columns, respectively. Each column interconnect line for each column can connect all output nodes of all memory banks in the column. The structure can further include sets of row interconnect lines, which interconnect adjacent memory banks within each row, and which communicate level shifted input voltages from memory bank to memory bank within the rows. Optionally, the structure can further include voltage buffers, which are integrated into at least some of the memory banks to buffer the level shifted input voltages and thereby compensate for IR drops.

Yet another embodiment of a structure disclosed herein can include an array of memory banks arranged in rows and columns. Each memory bank can include multiple input nodes, an output node, and a bitline. Each memory bank can further include multiple memory elements one for each input node. The memory elements can be arranged in a single column with multiple rows. Each memory element can include a programmable resistor and, particularly, a resistive random access memory-type programmable resistor connected between a corresponding input node and the bitline. Each memory bank can further include a feedback buffer circuit, which is connected to a bias node at one end of the bitline and further to the output node for the memory bank.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 8A-17A are schematic diagrams illustrating different additional components that could be incorporated into the disclosed structure to implement different writing schemes, respectively, for programming resistors;

FIGS. 8B-17B are corresponding conductance-to-pulse diagrams associated with FIGS. 8A-17A, respectively;

DETAILED DESCRIPTION

Figure 1A:
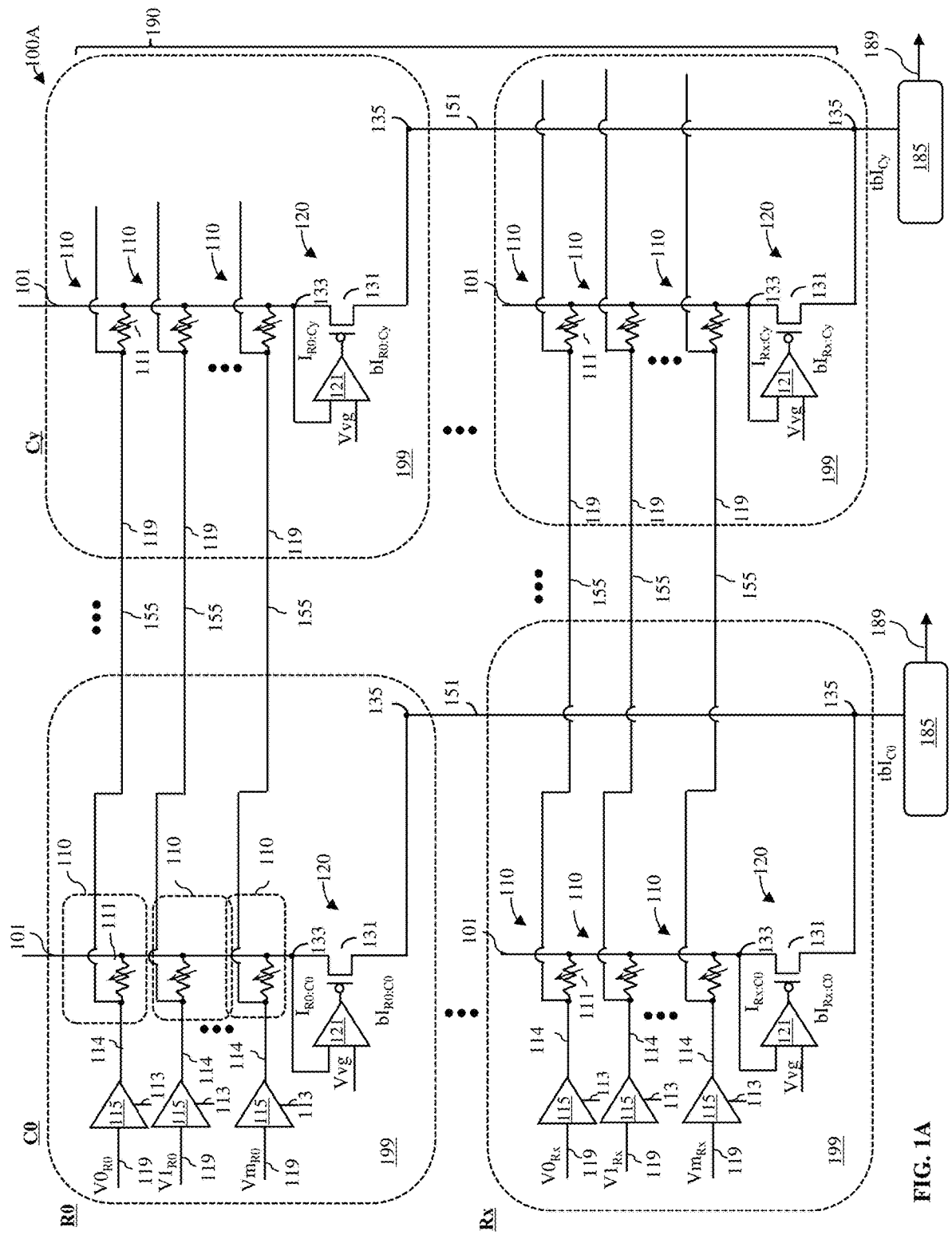
FIGS. 1A-1D are schematic diagrams illustrating different embodiments, respectively, of an in-memory processing structure.

As mentioned above, oftentimes, in a deep neural network designed, for example, for image processing, for audio processing, or for some ML or AI processing, the array of memory cells will need to be quite large. Unfortunately, such an increase in array size can result in an increase in local voltage ("IR") drops across the array, thereby leading to processing errors.

In view of the foregoing, disclosed herein are embodiments of a structure including a partitioned memory architecture configured for in-memory serial processing, such as for in-memory serial matrix vector multiplication processing. Specifically, the structure can include an array of memory banks arranged in interconnected columns and interconnected rows. Each memory bank can include a sub-column of memory elements with all sub-columns of memory elements from the memory banks in any given column of the memory banks in the array being interconnected, as discussed further below, to form a full column of memory elements for in-memory processing purposes. Each memory element can include a programmable resistor and can store a weight value as a function of the previously programmed resistance state of the resistor. During in-memory processing, input voltages (also referred to herein as activation values) can be received at input nodes for the memory elements in the initial memory banks of the rows of memory banks. Within the initial memory banks and prior to application to the memory elements, the input voltages can be level shifted by a virtual ground voltage (Vvg). Then, the level shifted input voltages can be communicated to the memory elements within the initial memory banks and further communicated along row interconnect lines from memory bank to memory bank within the same row for downstream processing. Voltage buffers can be integrated along the row interconnect lines, as necessary, to buffer the level shifted input voltages to compensate for IR drops. Additionally, within each memory bank, a buffer feedback circuit can be connected to a bias node on the bitline and to an output node. During in-memory processing, the feedback buffer circuit can bias the bitline to Vvg such that when level shifted (and optionally voltage boosted) input voltages are applied to the memory elements, respectively, in each memory bank, output currents are generated on the bitline for that memory bank, summed and then buffered such that a buffered bank-specific output current is output at the output node of each memory bank. All output nodes of all memory banks in the same column can be connected to a column interconnect line for that column. With this configuration, all buffered bank-specific output currents from the output nodes of all the memory banks in a specific column can be summed on the column interconnect line, thereby generating a column-specific output current. A current-to-voltage converter for each column can be connected to the column interconnect line and can output a column-specific analog output voltage as a function of the column-specific output current. This analog output voltage can represent a solution to a dot product computation. Such a partitioned memory architecture minimizes error-inducing local IR drops across the array (i.e., along signal lines in both the columns and the rows) and thereby improves processing performance. Additionally, the architecture keeps intermediate results in the analog domain, thereby avoiding the need for analog-to-digital (ADC) and digital-to-analog (DAC) converters typically employed in such processing.

FIGS. 1A-1D are schematic diagrams illustrating embodiments of a structure 100A-100D, respectively, including a partitioned memory architecture configured for in-memory serial processing, such as for in-memory serial matrix vector multiplication processing.

As illustrated in FIGS. 1A-1D, the structure 100A-100D can include a partitioned array of memory elements 110. Each memory element 110 can include a programmable resistor 111 (also referred to herein as variable resistor). The programmable resistor 111 can be any type of resistor having a controllable resistance and suitable for use as a non-volatile resistive memory element (i.e., a resistive memory element that retains its programmed resistance state even if/when the device loses power).

For example, the programmable resistor 111 can be a resistive random access memory (RRAM)-type programmable resistor. Alternatively, the programmable resistor 111 can be a phase change memory (PCM)-type programmable resistor, a magnetic tunnel junction (MTJ)-type programmable resistor, or any other suitable type of programmable resistor configured so that, by applying specific bias conditions to one or both opposing end terminals of the resistor, the resistance of the programmable resistor can be changed between at least two different stable resistance states. For example, the resistance states of such a programmable resistor can be programmed to a maximum resistance state, to a minimum resistance state, and optionally to one or more resistance states along a continuum between the minimum and maximum resistance states.

FIGS. 2A-2D illustrate an RRAM-type programmable resistor that could be employed for the programmable resistor 111 of each memory element. An RRAM is typically a back end of the line (BEOL) multi-layered structure, which includes two metallic layers 212 and 214 separated by a dielectric region 213 (also referred to herein as a resistance switching region). Depending upon the specific materials used and on the biasing conditions applied to the opposing end terminals 221-222 of such a resistor during a write operation, metal ions migrate to: (a) grow conductive filament(s) 215 in the dielectric region 213 extending between the metallic layers 212 and 214 so that the resistance state of the RRAM-type programmable resistor decreases or (b) break down conductive filament(s) within the dielectric region 213 between the metallic layers 212 and 214 so that the resistance state of the RRAM-type programmable resistor increases. Those skilled in the art will recognize that the total number of stable resistance states achievable with such an RRAIVI-type programmable resistor can vary depending upon the materials used and the biasing conditions. An RRAIVI-type programmable resistor could include metallic layers 212-214 (e.g., of platinum (Pt), titanium (Ti), titanium nitride (TiN), etc.) and, between the metallic layers 212-214, a dielectric region 213 including an oxide layer, such as a tantalum oxide (Ta2O5) layer, a hafnium oxide (HfO2) layer, an iron oxide (Fe2O3) layer, a titanium oxide (TiO2) layer, etc. However, the addition of one or more thin interface barrier layers (e.g., a second oxide layer, such as aluminum oxide (Al2O3) or some other oxide layer, an amorphous silicon layer, or some other suitable interface barrier layer) between the oxide layer and one or both metallic layers can improve the switching characteristics and increase the number of different detectable stable resistance states between a minimum resistance state and a maximum resistance state.

Figure 3A:
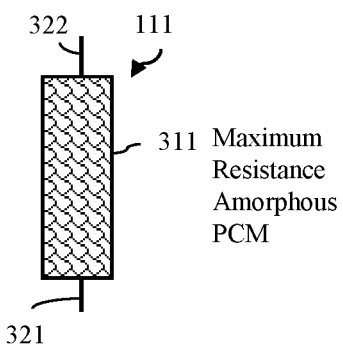
FIGS. 3A-3B are cross-section diagrams illustrating some resistance states of a phase change memory (PCM)-type programmable resistor that could be incorporated into the disclosed structure.
Figure 3B:
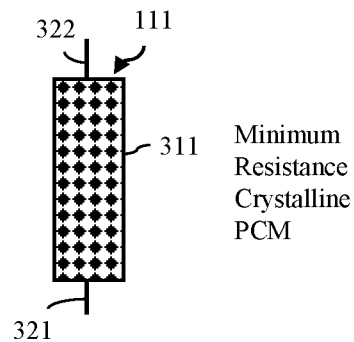

FIGS. 3A-3B illustrate a PCM-type programmable resistor that could be employed for the programmable resistor 111 of each memory element 110. A PCM-type programmable resistor includes a phase change material 311 (e.g., a chalcogenide compound) with programmable structural phases that exhibit different stable resistance states. For example, in a fully amorphous phase, exemplified by the drawing shown in FIG. 3A, the resistor will have the maximum resistance, whereas in a fully crystalline phase, exemplified by the drawing shown in FIG. 3B, the resistor will have the minimum resistance. In any phase between the fully amorphous phase and the fully crystalline phase (i.e., a partially amorphous and partially crystalline structure) the resistor will have a resistance between the maximum and the minimum resistances. Phase changes are dependent upon the local temperature of the PCM, which is controlled by the length and strength of an applied voltage. For example, changing from a crystalline phase toward or to an amorphous phase can be achieved by applying a short high voltage pulse to one or both of the opposing end terminals 321-322 in order to quickly heat the phase change material above its melting point, whereas changing from an amorphous phase toward or to a crystalline phase can be achieved by applying a longer lower voltage pulse to one or both of the opposing terminals 321-322 in order to heat the phase change material to its crystallization temperature and then allowing it to cool.

Figure 4A:
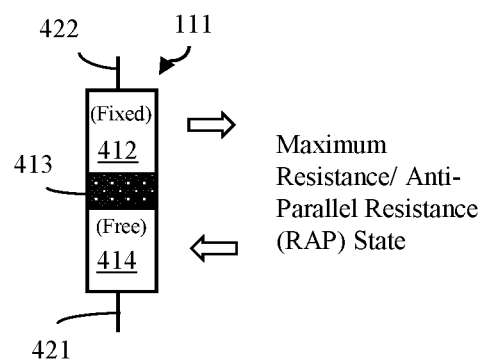
FIGS. 4A-4B are cross-section diagrams illustrating some resistance states of a magnetic tunnel junction (MTJ)-type programmable resistor that could be incorporated into the disclosed structure.
Figure 4B:
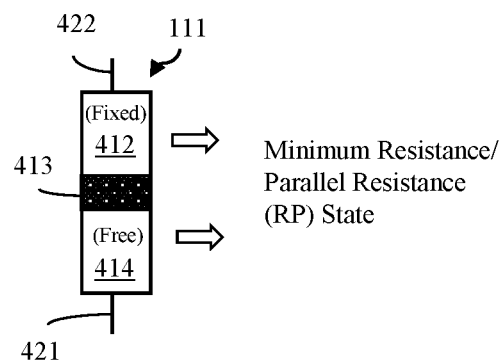

FIGS. 4A-4B illustrate a MTJ-type programmable resistor that could be employed for the programmable resistor 111 of each memory element 110. An MTJ-type programmable resistor is typically a back end of the line (BEOL) multi-layered structure, which includes a free ferromagnetic layer 414 (also referred to as a switchable layer) at a first terminal 421, a fixed ferromagnetic layer 412 (also referred to as a pinned layer) at a second terminal 422, and a thin dielectric layer 413 (e.g., a thin oxide layer) between the free ferromagnetic layer 414 and the fixed ferromagnetic layer 412. Depending upon the biasing conditions on the two terminals 421-422 and, particularly, depending on the voltage differential between the two terminals during a write operation, the MTJ-type programmable resistor can exhibit different stable resistance states. For example, during a write operation, a high positive voltage (Vcc) can be applied to the second terminal 422 and the first terminal 421 can be discharged to ground (e.g., at 0V). In this case, the free ferromagnetic layer 414 switches to (or maintains) the anti-parallel resistance (RAP) state (also referred to as a high resistance state) (see FIG. 4A). Alternatively, during the write operation, Vcc can be applied to the first terminal 421 and the second terminal 422 can be discharged to ground (e.g., at 0V). In this case, the free ferromagnetic layer 414 switches to (or maintains) a parallel resistance (RP) state (also referred as a low resistance state) (see FIG. 4B). The MTJ structure described above has two resistance states. However, the example is not intended to be limiting and those skilled in the art will recognize that MTJ-type programmable resistors have been developed that can exhibit more than two different resistance states.

Referring again to FIGS. 1A-1D, in each memory element 110, one terminal of the programmable resistor 111 (e.g., an input terminal) can be electrically connected to a corresponding input node 119 (either directly or indirectly through an amplifier 115 or voltage buffer 116, as discussed in greater detail below). Additionally, the opposite terminal of the programmable resistor 111 (e.g., an output terminal) can be electrically connected to a bitline 101, as discussed in greater detail below.

For in-memory processing, such as for in-memory matrix vector multiplication processing, the structure 100A-100D can operate in a normal operational mode (also referred to herein as the mission mode). During this normal operational mode, each memory element 110 has already been pre-programmed to a specific resistance state representing a total weight value (also referred to herein as a total data value or a specific total weight value). As mentioned above, the programmable resistor 111 can have multiple different resistance states (e.g., 2, 3, 4, etc.) and, in one embodiment, the programmable resistor 111 can have a relatively large number of resistance states (e.g., sixteen or more programmable resistance states).

The memory elements 110 of the structure 100A-100D can be arranged in a memory element array. The full size of the memory element array (i.e., the number of columns and rows of memory elements in the memory element array) can depend upon the application. Relatively complex neural networks (e.g., for image processing, for audio processing, or the like) can require a relatively large memory element array to complete in-memory processing (e.g., an array including 10's or 100's of memory elements per row and column).

In any case, in the structure 100A-100D the memory element array is partitioned (i.e., is a partitioned array). Specifically, each column of memory elements 100 in the memory element array is partitioned into two or more smaller groups (also referred to herein as sub-columns). For purposes of this disclosure, each partition (or section) of a memory element array that includes such a sub-column is referred to herein as a memory bank 199.

With partitioning as described above, the structure 100A-100D includes an array 190 of memory banks 199 (i.e., partitions or sections) that are arranged columns (C0-Cy) and rows (R0-Rx). Since only the columns of memory elements from the memory element array are partitioned, the total number of columns (C) of memory banks 199 within the memory bank array 190 is the same as the total number of columns of memory elements 110 from the pre-partitioned memory element array.

In some embodiments, each memory bank 199 can have the same number (m+1) of multiple rows (r0-rm) of memory elements 110 therein and the total number of memory banks 199 in each column times the total number of rows of memory elements 110 in each memory bank 199 can be equal to the total number of rows of memory elements 110 as in the memory element array prior to partitioning. Thus, for example, if a 64×64 memory element array is partitioned in the structure 100A-100D, there can be 64 columns (C0-C63) of memory banks and x+1 rows (R0-Rx) of memory banks 199, each with m+1 rows (r0-rm) of memory elements 110, where x≥1 and m≥1, where 64 is divisible by x+1, and where the number m+1 is a whole number equal to 64/x+1. That is, the number of rows (R0-Rx) of memory banks 199 could be 2 with each memory bank 199 having 32 rows (r0-rm) of memory elements 110; the number of rows (R0-Rx) of memory banks 199 could be 4 with each memory bank 199 having 16 rows (r0-rm) of memory elements 110; the number of rows (R0-Rx) of memory banks 199 could be 8 with each memory bank having 8 rows (r0-rm) of memory elements; and so on. Similarly, if a 128×128 memory element array is partitioned in the structure 100A-100D, there will be 128 columns (C0-C127) of memory banks 199 and x+1 rows (R0-Rx) of memory banks 199 with m+1 rows (r0-rm) of memory elements 110 in each memory bank 199, where x≥1 and m≥1, where 128 is divisible by x+1, and where the number m+1 is a whole number equal to 128/x+1.

If a 256×256 memory element array is to be partitioned in the structure 100A-100D, there will be 256 columns (C0-C255) of memory banks 199 and x+1 rows (R0-Rx) of memory banks 199 with m+1 rows (r0-rm) of memory elements 110 in each memory bank 199, where x≥1 and m≥1, where 256 is divisible by x+1, and where the number m+1 is a whole number equal to 256/x+1, and so on. For purposes of illustration, a 2×2 memory bank array with only three rows of memory elements per memory bank is shown in the figures.

However, in the disclosed embodiments partitioning of the columns of memory elements of a memory element array into memory banks is performed by designers to minimize the effect of wiring resistance across the array. Thus, there is no requirement for uniform partitioning. For example, in some embodiments each memory bank could have the maximum number of rows necessary before buffering becomes necessary with the last memory bank in each column having some lessor number of rows to include. In other embodiments, the number of rows in each memory back in each column can drop (with each memory bank or with each group of memory banks) between the first memory bank in the column to the last memory bank in the column.

Therefore, it should be understood that the figures are not intended to be limiting. Alternatively, the memory bank array 190 in the structure 100A-100D could include any number of two or more columns (C0-Cy) of memory banks 199 and any number of two or more rows (R0-Rx) of memory banks 199 with any number of two or more rows (r0-rm) in any given memory bank within each column with the number of rows in each memory bank in each column being the same or different.

In any case, each memory bank 199 can include a sub-column of memory elements 110, as discussed above. Each memory bank 199 can further include corresponding input nodes 119, one for each memory element 110 in the sub-column. Each memory bank 199 can further include a bitline 101. The programmable resistor 111 of each memory element 110 in the sub-column of a memory bank can have its input terminal connected to the corresponding input node 119 directly (or, indirectly via an amplifier 115 or voltage buffer 116, as discussed below), and its output terminal connected to the bitline 101 for that memory bank.

The discussion below refers to initial memory banks in the rows (R0-Rx) of memory banks. The initial memory banks refer to the memory banks 199 at the beginning of each row (R0-Rx) within the first column (C0). Within the structure 100A-100D, each initial memory bank can include multiple amplifiers 115. Each amplifier 115 can be connected between the corresponding input node 119 for a memory element 110 and the memory element 110 itself. When the structure 100A-100D is in the normal operational mode for in-memory serial processing (e.g., for in-memory serial matrix vector multiplication processing), specific input voltages from a sample can be received at the corresponding input nodes 119 (e.g., $V0_{R0}$ at the first row (r0) in the Bank R0:C0, $V1_{R0}$ at the second row (r1) of the Bank R0:C0; and so on). The specific input voltages can, for example, correspond to specific activation values.

It should be noted that the specific input voltages that would have been received at each row in a non-partitioned memory element array will similarly be received at each row in the partitioned array of the structure 100A-100D. That is, the input voltage $V0_{R0}$ received at the first row (r0) of Bank R0:C0 corresponds to the input voltage that would have been received by at the first row/first column of a non-partitioned array and the last input voltage $Vm_{Rx}$ received at the last row of the last Bank Rx:C0 corresponds to the input voltage that would have been received at the last row/first column of the non-partitioned array.

Each amplifier 115 can be connected so as to receive a specific input voltage and can be configured to generate and output a level shifted input voltage 114 that is essentially equal to the sum of the specific input voltage and a virtual ground voltage (Vvg), as discussed in greater detail below. That is, the amplifier 115 can add Vvg to the specific input voltage. For example, the first amplifier 115 in Bank R0:C0 that receives $V0_{R0}$ can generate and output a level shifted input voltage 114 equal to $V0_{R0}$ plus Vvg, the next amplifier 115 in Bank R0:C0 that receives $V1_{R0}$ can generate and output a level shifted input voltage 114 equal to $V1_{R0}$ plus Vvg, and so on with the last amplifier 115 in Bank Rx:C0 generating and outputting a level shifted input voltage 114 equal to $Vm_{Rx}$ plus Vvg. The level shifted input voltage 114 output from any given amplifier 115 will be applied to the memory element 110 connected thereto and, more particularly, to the input terminal of the programmable resistor 111.

Those skilled in the art will recognize that Vvg is used in analog circuits to refer to a voltage, which is established on a node, which has a certain DC bias that is maintained at a steady reference potential without being connected directly to that reference potential, and which has 0V from an AC perspective. Vvg is typically established on a node to essentially function as a "ground" terminal that is level shifted by a fixed DC amount. For example, amplifiers can be configured in a negative feedback loop to force their negative input voltage to be equal to the positive input voltage. In this context, the negative input voltage is referred to as Vvg because there is effectively no potential difference between it and the positive terminal. Alternatively, Vvg could be established with a large capacitor which holds a DC voltage and essentially has zero AC across it. Each amplifier 115 can be a simple voltage level shifter (also referred to herein as a level shifting amplifier). Alternatively, each amplifier 115 can be configured as a multistate amplifier, where the output state of any given amplifier 115 is controlled by a unique control bit 113 for that amplifier (e.g., control bit $S0_{R0}$ for the amplifier 115 in the first row of the first initial memory bank R0:C0, control bit $S1_{R0}$ for the amplifier 115 in the next row of the first initial memory bank R0:C0, and so on until the last control bit $Sm_{Rx}$ for the amplifier 115 of the last row of the last initial memory bank Rm:C0). In this case, depending upon the control bit received, an amplifier 115 can output a level shifted input voltage (e.g., during the normal operational mode) or some other suitable output, such as a low output (e.g., ground), a high output (e.g., Vcc), or a high impedance (HiZ) output. Different outputs, such as a low voltage, a high voltage, or a HiZ output, could facilitate other operational modes such as program or erase operations, as described in greater detail below.

The structure 100A-100D can further include sets of row interconnect lines 155. Each set of row interconnect lines 155 can interconnect adjacent memory banks within the same row (R0-Rx) of memory banks. Specifically, each row interconnect line 155 within a set between adjacent memory banks of a given row of memory banks can connect the input terminal of the programmable resistor 111 of one memory element 110 at a particular bank row address (e.g., r0-rm) in an upstream memory bank to the input node for another memory element at the same bank row address in an adjacent downstream memory bank. Thus, for example, if the structure 100A-100D only includes two columns of memory banks (e.g., if C0 is the initial memory bank in a given row of memory banks and Cy is the next and last memory bank in the same row), the first row interconnect line 155 in the set between Bank R0:C0 and Bank R0:Cy would connect the input terminal of the programmable resistor 111 of the memory element 110 in row r0 of Bank R0:C0 to the input node 119 for the memory element 110 in row r0 of the adjacent downstream Bank R0:Cy, the second row interconnect line 155 in the set between Bank R0:C0 and Bank R0:Cy would connect the input terminal of the programmable resistor 111 of the memory element 110 in row r1 of Bank R0:C0 to the input node 119 for the memory element 110 in row r1 of the downstream Bank R0:Cy, and so on. Thus, the level shifted input voltages generated by the amplifiers in the initial memory banks are transmitted along row interconnect lines to memory elements at the same address in the downstream memory banks within the same row.

Figure 1B:
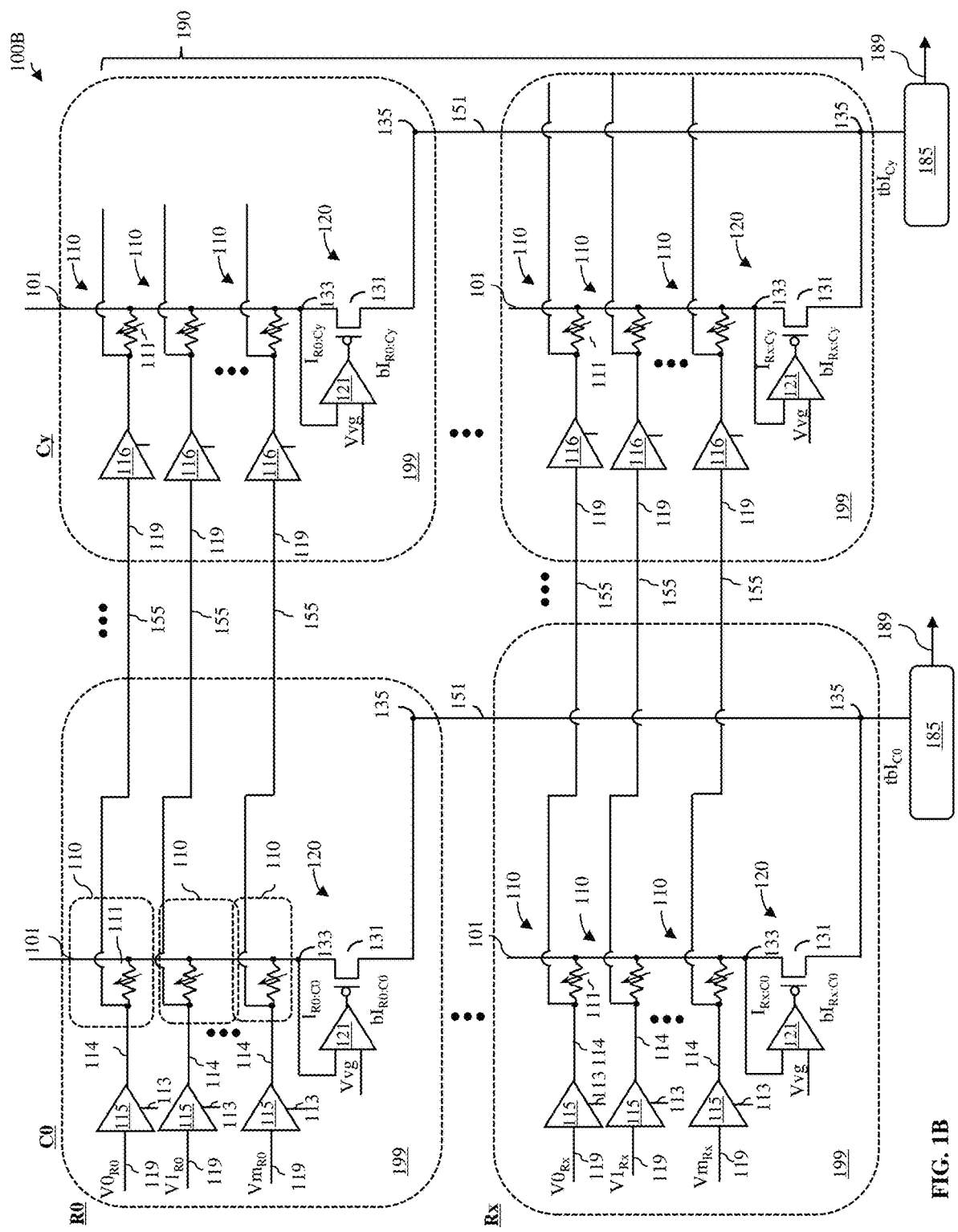

Optionally, to minimize IR drops across the row interconnect lines as the level shifted input voltages are communicated to each memory element at the same address in each memory bank in the same row, some embodiments of the disclosed structure (e.g., see the embodiments of the structure 100B shown in FIG. 1B or 100D shown in FIG. 1D) can also include voltage buffers 116 (also referred to herein as voltage boost amplifiers). For example, if the size of the array of memory banks is relatively large and, particularly, if the number of columns (C0-Cy) is so large that significant IR drops are exhibited along the row interconnect lines 155, then at least some of memory banks 199 can have integrated voltage buffers 116 (e.g., between the input nodes 119 and the memory elements 110) to buffer the level shifted input voltages and, thereby compensate for IR drops.

As mentioned above, each memory bank 199 can further include a bitline 101. The programmable resistor 111 of each memory element 110 within any given memory bank can have its input terminal connected to the input node 119, either directly (or indirectly via an amplifier 115 or voltage buffer 116, as discussed below) and its output terminal connected to the bitline 101. Each memory bank 199 can further include a bias node 133 on the bitline 101, an output node 135, and a feedback buffer circuit 120, which is connected to the bias node 133 and to the output node 135. The feedback buffer circuit 120 can include, for example, a transistor 131 (e.g., a P-type field effect transistor (PFET)) connected in series between the bias node 133 and the output node 135 and a buffer amplifier 121, which has one input connected to the bias node 133, another input connected to receive Vvg, and an output connected to the gate of the PFET 131.

With the above-described feedback buffer circuit 120 in each memory bank 199, when the structure 100A-100D is in the normal operational mode for in-memory serial processing, the feedback buffer circuit 120 can bias the bias node 133 to Vvg. Additionally, as mentioned above, the level shifted input voltages, which have each been level shifted by Vvg and which are output by the amplifiers 115, are received at the input terminals of the memory elements 110 in the initial memory banks and further received at the input nodes for the memory elements 110 in the downstream memory banks. As a result, the voltage across the programmable resistor 111 of each memory element 110 at the same bank row address in the memory banks within the same row will be essentially equal to the received input voltage. Additionally, output currents from all programmable resistors 111 of all memory elements 110 in any specific memory bank are output to and summed on the bitline 101, thereby generating a bank-specific output current (I). This bank-specific output current is further buffered by the feedback buffer circuit 120 such that a buffered bank-specific output current (bI), which is dependent on the sum of all output currents from all programmable resistors of all memory elements in the specific memory bank, is output on the output node 135 for the specific memory bank.

The structure 100A-100D can further include column interconnect lines 151 for the columns (C0-Cy), respectively. Each column interconnected line for each column can be electrically connected to all output nodes 135 of all memory banks 199 in the same column. That is, the column interconnect line 151 for column C0 will be connected to the output nodes 135, respectively, of all memory banks in the column C0 (i.e., for Banks R0:C0-Rx:C0), and so on. When the structure 100A-100D is in the normal operational mode for in-memory serial processing, the column interconnect line 151 for any specific column can receive and sum the buffered bank-specific output currents from all the memory banks in that specific column, thereby generating a column-specific output current (e.g., $tbI_{C0}=bI_{R0:C0}+ \ldots +bI_{Rx:C0}; \ldots$; and $tbI_{Cy}=bI_{R0:Cy}+ \ldots +bI_{Rx:Cy}$). By buffering the bank-specific output currents output to the column interconnect lines 151, the impact of wiring resistance across the length of the columns is diminished.

The structure 100A-100D can further include current-to-voltage converters (also referred to herein as converters or current-to-voltage converter circuits). Each current-to-voltage converter 185 for each column can be connected to the column interconnect line 151 for that column, can receive the column-specific output current from the column interconnect line 151, and can generate and output a column-specific analog output voltage 189 based on the column-specific output current. Since output currents from memory elements 110 in each memory bank are generated on the bitline 101 in the memory bank as a function of programmed resistance states representing a weight value and on received input voltages representing activation values, the column-specific output current on each column interconnect line 151 can represent a current value solution for a dot product computation and the column-specific analog output voltage can represent a voltage value solution for that dot product computation.

It should be noted that various current-to-voltage converter configurations are known in the art and can be employed in the structure 100A-100D.

Figure 5A:
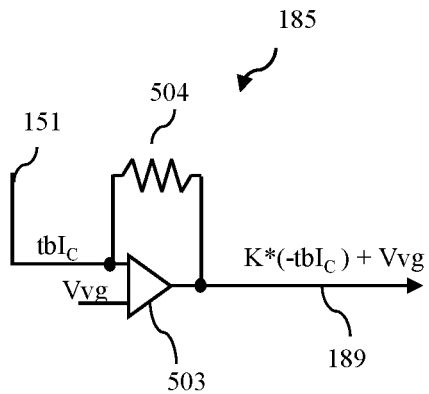
FIGS. 5A-5E are schematic diagrams illustrating current-to-voltage converter circuits that could be incorporated into the disclosed structure.

For example, FIGS. 5A-5E are schematic diagrams illustrating current-to-voltage converters 185, respectively, that can be incorporated into the structure 100A-100D. In FIG. 5A, the current-to-voltage converter 185 includes an amplifier 503 and a feedback resistor 504. The amplifier 503 has a first input connected to the column interconnect line 151, a second input connected to receive Vvg, an output. The feedback resistor 504 is connected between the output and the first input of the amplifier. The feedback resistor 504 can be the same type of programmable resistor as that used in the memory elements. It should be noted that the polarity of the column-specific analog output voltage 189 from the amplifier 503 will be the opposite of that of the column-specific output current on the column interconnect line 151.

Figure 5B:
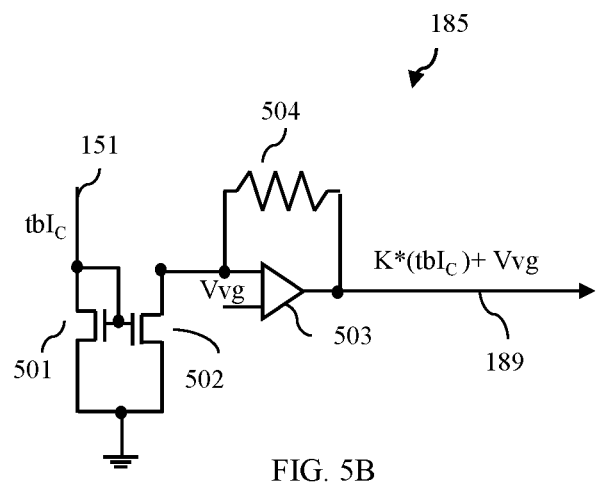

The current-to-voltage converter 185 of FIG. 5B is similar to that of FIG. 5A but it also includes additional circuitry to ensure the polarity of the column-specific output current on the column interconnect line and the column-specific output voltage are the same. Specifically, in FIG. 5B, the current-to-voltage converter 185 includes a first stage and a second stage. The first stage includes first and second n-type field effect transistors (NFETs) 501-502 and the second stage includes the amplifier 503 and the feedback resistor 504. The first NFET 501 is connected in series between the column interconnect line 151 and ground. The second NFET 502 is connected in series between the first input of the amplifier 503 and ground. The drain node of the first NFET 501 can control the gates of the first and second NFETs 501-502.

Figure 5C:
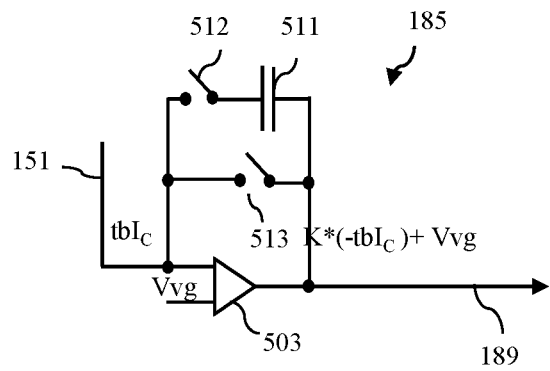

The current-to-voltage converter 185 of FIG. 5C includes the amplifier 503, but instead of a feedback resistor, it includes a feedback switched capacitor circuit. Specifically, the amplifier 503 has a first input connected to the column interconnect line 151, a second input connected to receive Vvg, and an output. The feedback switched capacitor circuit includes a capacitor 511 that is connected to the output of the amplifier 503 and further connected by a first switch 512 to the first input. The feedback switched capacitor circuit also includes a bypass switch 513 that connects the output to the first input of the amplifier 503, bypassing the capacitor 511. In operation, initially the bypass switch 513 is closed to stabilize the high impedance node at Vvg. Then, the bypass switch 513 is opened and there will be a finite integration time across the capacitor 511. This integration time can be made to be proportional to the temperature coefficient of a programmable resistor used in the memory elements. Alternatively, the integration time can be made proportional to a resistor that is made of the same material as the programmable resistors and whose value at the typical temperature of operation is fixed. For example, a resistor value can be selected that has a nominal resistor value representative of the variety of resistor values that can appear in the programmable resistors within the array. That is, if the programmable resistors within the array can have values between 20 k and 500 k, then a nominal resistor value (e.g., 50 k) can be selected based on simulations and measurements to minimize the impact of the TCs of the resistors used in the array. It should be noted that this integration time will also determine the magnitude of the output signal and will compensate for the temp-coefficient. Furthermore, due to the switched capacitor circuit configuration, the value of the output can be held for some duration of time (e.g., track and hold circuit), the capacitor 511 can reference some other bias potential, and the power for the op-amp can be turned off to save power. It should be noted that the polarity of the column-specific analog output voltage 189 from the amplifier 503 will be the opposite that of the column-specific output current on the column interconnect line 151.

Figure 5D:
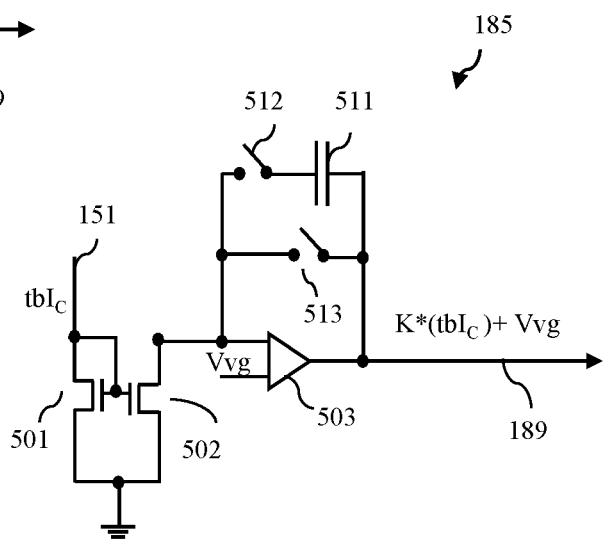

The current-to-voltage converter 185 of FIG. 5D is similar to the current-to-voltage converter of FIG. 5C but includes additional circuitry to ensure the polarity of the column-specific output current on the column interconnect line and the column-specific output voltage are the same. Specifically, in this case the current-to-voltage converter includes a first stage and a second stage. The first stage includes first and second n-type field effect transistors (NFETs) 501-502 and the second stage includes the amplifier 503 and the feedback resistor 504. The first NFET 501 is connected in series between the column interconnect line 151 and ground. The second NFET 502 is connected in series between the first input of the amplifier 503 and ground. The drain node of the first NFET 501 can control the gates of the first and second NFETs 501-502.

Figure 5E:
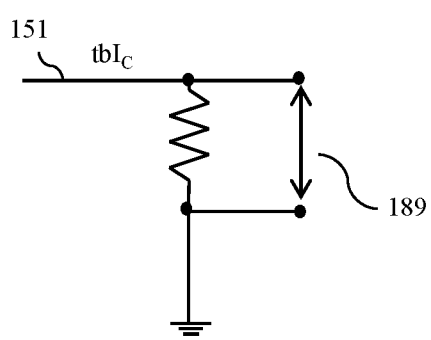

The current-to-voltage converters described above and illustrated in FIGS. 5A-5D are provided for illustration purposes and are not intended to be limiting. Alternatively, any other suitable current-to-voltage converter circuit could be incorporated into the structure 100A-100D. For example, the current-to-to voltage converter could, alternatively, be in the form of a simple resistor connected between the column interconnect line and ground, as shown in FIG. 5E.

Figure 1C:
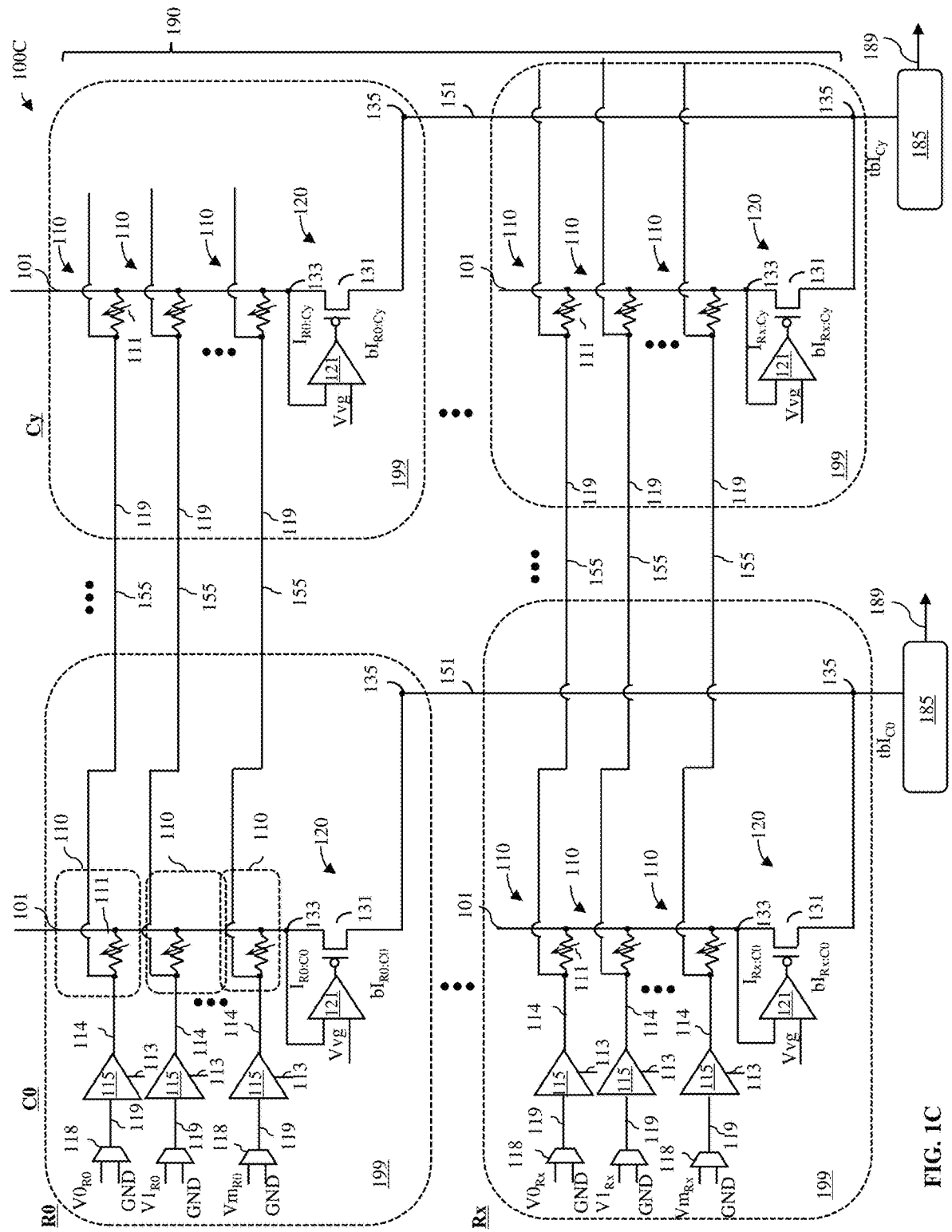
Figure 1D:
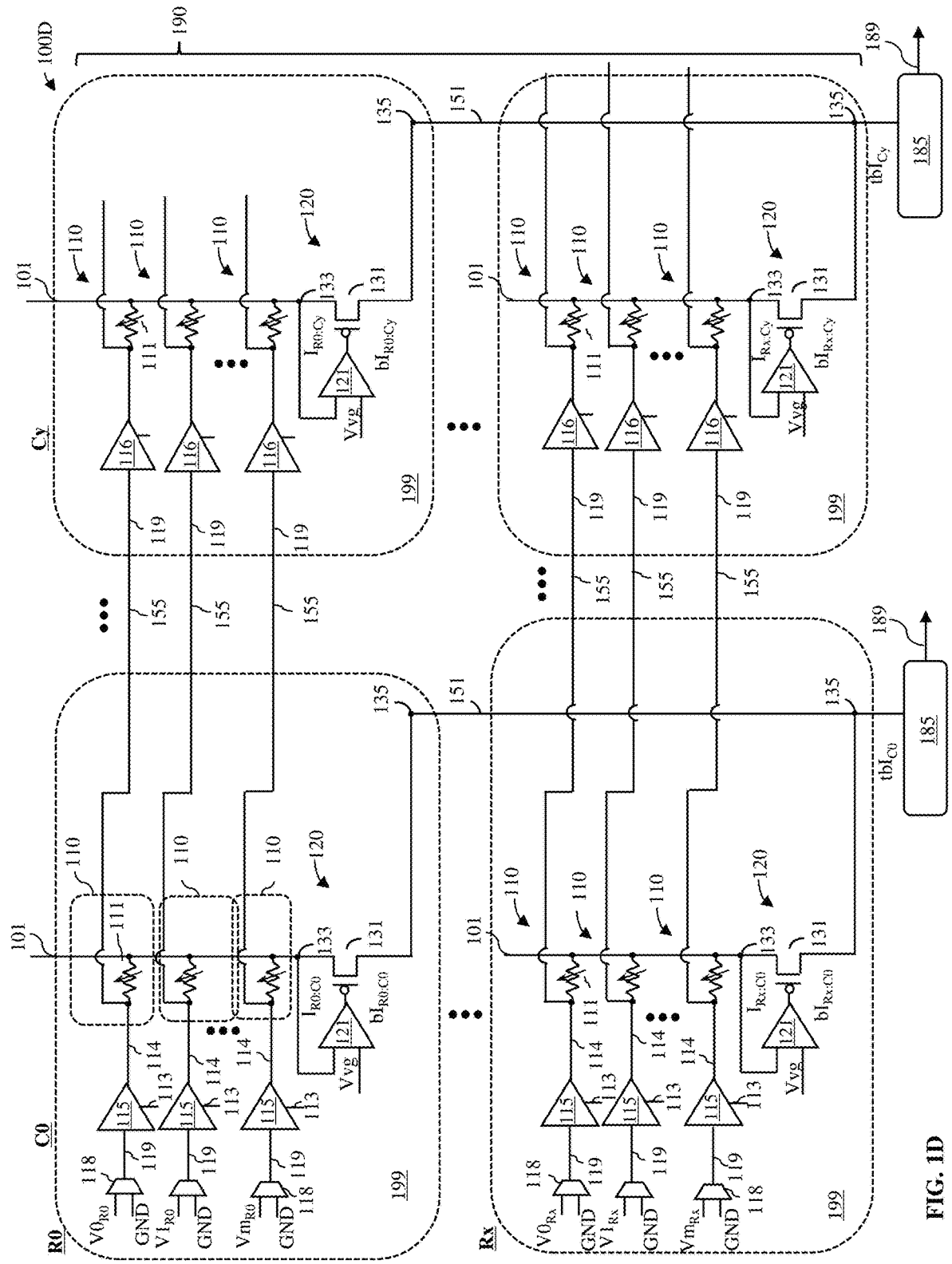
Figure 2A:
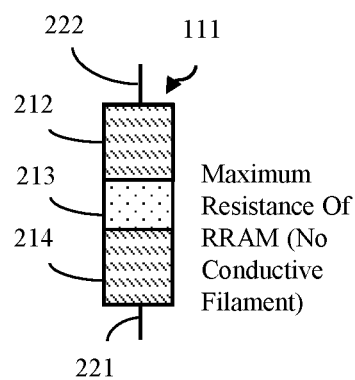
FIGS. 2A-2D are cross-section diagrams illustrating resistance states of a resistive random access memory (RRAM)-type programmable resistor that could be incorporated into the disclosed structure.
Figure 2B:
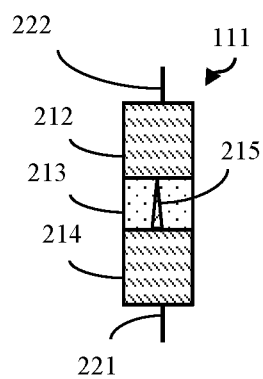
Figure 2C:
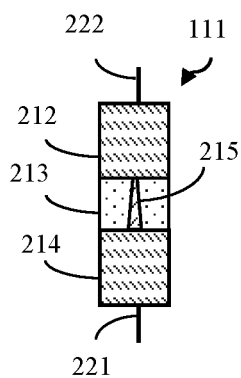
Figure 2D:
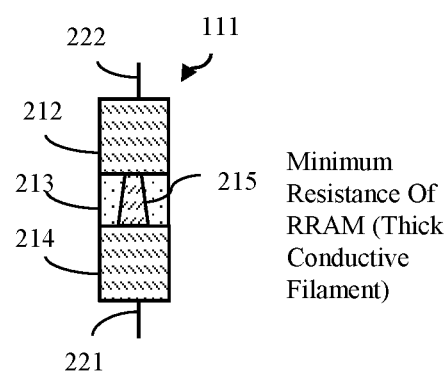

Optionally, the structure disclosed herein can further include multiplexors 118 (e.g., see the structure 100C of FIGS. 1C and 100D of FIG. 1D). For example, output ports of the multiplexors 118 can be connected to the input nodes 119 and, thereby to the voltage amplifiers 115, respectively, in the initial memory banks. Each multiplexor 118 can have two or more input ports and a single output port. The input ports can receive different inputs, respectively, which may be required for different operational modes. For example, one input port could receive a specific input voltage to be used for in-memory serial processing in the normal operational mode, another input port could receive a ground voltage for use in an offset compensation mode, and/or yet another input port could receive some other voltage for use in some other operational mode. In any case, each amplifier 115 could be connected between the single output port of a corresponding multiplexor 118 and a given memory element 110. Depending upon the operational mode of the structure, the multiplexor 118 can selectively connect one of the input ports to the output port and, thereby to the amplifier 115.

As mentioned above, FIGS. 1A-1D are schematic diagrams illustrating embodiments of a structure 100A-100D including a partitioned memory architecture configured for in-memory serial processing, such as in-memory serial matrix vector multiplication processing. It should be understood that with in-memory serial processing each processing layer (e.g., each multiply and accumulate (MAC) layer) will be handled by a discrete structure configured as described above (i.e., a discrete partitioned memory architecture) with the outputs from one structure for one MAC layer being fed, as inputs, to the next structure for the next MAC layer in the series. The number of inputs into a MAC Layer will be greater than the number of outputs from that MAC layer and, thus, the number of inputs to each MAC Layer in the series decreases until a final output is produced.

Figure 6:
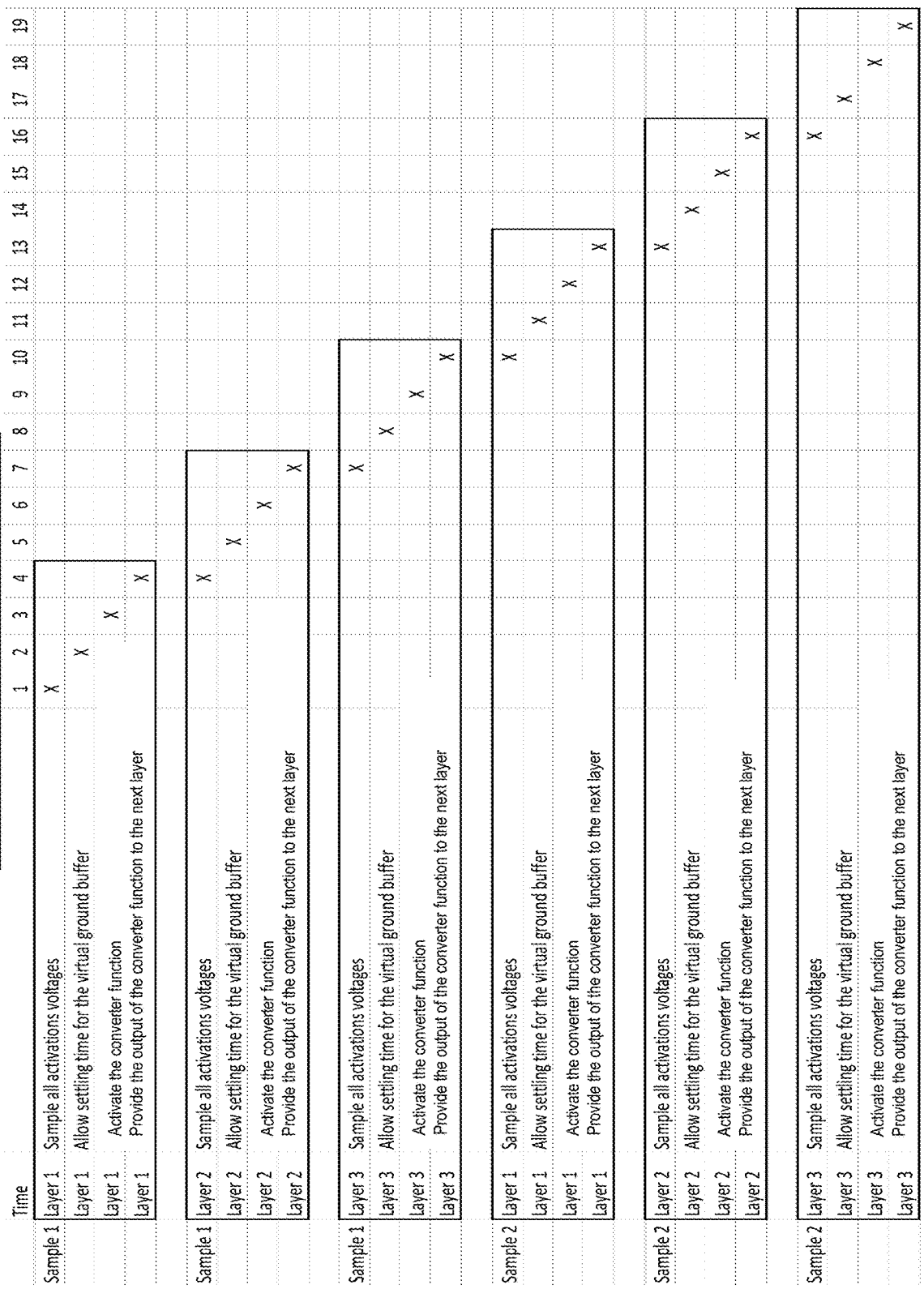
FIG. 6 is an example of a timing diagram for in-memory serial processing using the disclosed structure.

FIG. 6 is an example of a timing diagram for in-memory serial processing using a series of discrete structures (each structure in the series being an instance of a structure 100A-100D and described above) to complete a series of MAC layers, respectively, on multiple samples. The in-memory serial processing begins with the input MAC layer (Layer 1) structure processing a first sample (Sample 1). Time 1, Sample 1 input voltages are input into the Layer 1 structure (i.e., all activation voltages are sampled). Time 2, within the Layer 1 structure, the input voltages are level-shifted by Vvg and the bitlines are biased to Vvg (i.e., allow settling time for the Vvg buffer). Time 3, within the Layer 1 structure, the current-to-voltage converters are activated. Time 4, the column-specific output voltages generated by the current-to-voltage converters of the Layer 1 structure are fed to a Layer 2 structure, which processes a hidden MAC layer. These above-described processes are repeated in the Layer 2 structure. That is, Time 4, within the Layer 2 structure, column-specific output voltages from the Layer 1 structure are received as input voltages. Time 5, within the Layer 2 structure, the input voltages are level-shifted by Vvg and the bitlines are biased to Vvg (i.e., allow settling time for the Vvg buffer). Time 6, within the Layer 2 structure, the current-to-voltage converters are activated. Time 7, the column-specific output voltages generated by the current-to-voltage converters of the Layer 2 structure are fed to a Layer 3 structure, which processes another hidden MAC layer. These above-described processes are repeated in the Layer 3 structure. That is, Time 7, within the Layer 3 structure, the column-specific output voltages from the Layer 2 structure are received as input voltages. Time 8, within the Layer 3 structure, the input voltages are level-shifted by Vvg and the bitlines are biased to Vvg (i.e., allow settling time for the Vvg buffer). Time 9, within the Layer 3 structure, the current-to-voltage converters are activated. Time 10, the column-specific output voltages generated by the current-to-voltage converters of the Layer 3 structure are fed to a Layer 4 structure. Layer structure-to-Layer structure processing continues as described above until the final solution for Sample 1 is output by the final Layer structure in the series. Only after the final solution for Sample 1 is output from the final Layer structure in the series will in-memory serial processing begin on the next sample (e.g., Sample 2) with the MAC layer processing described above being repeated, and so on. For purposes of illustration, FIG. 6 only shows 3-layer processing. However, it should be understood that FIG. 6 is not intended to be limiting and that such MAC processing typically requires significantly more layers to develop a final solution.

Those skilled in the art will recognize that control and connecting circuitry would be required to perform the in-memory processing within each layer structure and to further feed outputs from one layer structure to the appropriate inputs in the next layer structure. Such circuitry is known in the art and, thus, the details thereof have been omitted from this specification The disclosed structures (e.g., see the structures 100A-100D shown in FIGS. 1A-1D, respectively) can also include additional components for implementing other operational modes (e.g., in program modes). For example, as mentioned above prior to operation of the structure 100A-100D in the normal operational mode (i.e., in the mission mode during which in-memory serial processing is performed), the programmable resistor 111 of each memory element 110 must be pre-programmed to some programmed resistance state so that each memory element 110 in the structure 100A-100D stores a total weight value. Depending upon the type of programmable resistors used, different write schemes could be employed to achieve the desired programming of each programmable resistor in each memory element and the different write schemes may necessitate the inclusion of additional circuit components. The details of these components are not shown in FIGS. 1A-1D to avoid clutter in the drawings and to allow the reader to focus on the salient aspects of the disclosed embodiments. However, FIGS. 7, 8A, 9A, 10A, 11A, 12A, 13A, 14A, 15A, 16A, and 17A are schematic diagrams illustrative of additional circuit components that could be incorporated into the structure 100A-100D and used to implement different write schemes, respectively, for an RRAM-type programmable resistor. It should be understood that, while the additional circuit components illustrated in the FIGS. 7, 8A, 9A, 10A, 11A, 12A, 13A, 14A, 15A, 16A, and 17A are shown with respect to the programming of one programmable resistor 111 of a single memory element 110, the same additional circuit components could be integrated throughout the structure 100A-100D to facilitate programming of both the programmable resistors 111 of all of the memory elements 110 of all of the memory banks 199 in the memory bank array 190.

Figure 7:
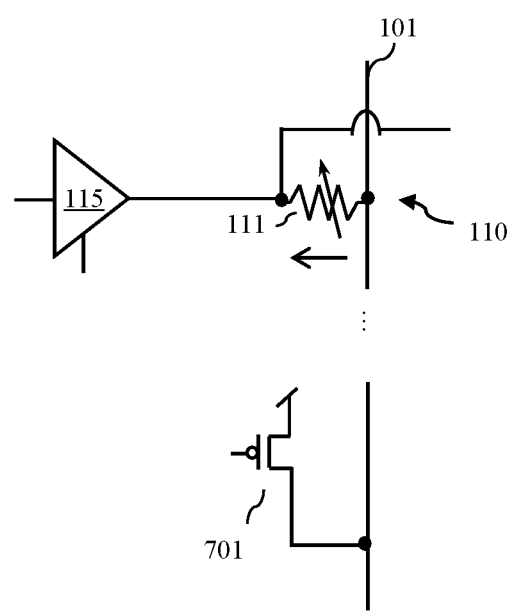
FIG. 7 is a schematic diagram illustrating additional components that could be incorporated into the disclosed structure to implement a writing scheme for programming resistors.

More specifically, FIG. 7 is a schematic diagram illustrating additional components that could be employed to implement one writing scheme. Referring to FIG. 7 in combination with any of FIGS. 1A-1D, a weak PFET 701 can have a source region connected to a positive supply voltage (e.g., Vcc) and a drain region connected to a programming node on a bitline 101. During a write mode, the feedback buffer circuit 120 can be switched off and the output of the amplifier 115 can be switched to a low value. The gate of the PFET 701 can be controlled by a write control signal that is lowered (e.g., by a control signal from a controller, not shown) in small increments to increase the conductivity of the PFET 701. As the PFET 701 gradually turns on, there will be a corresponding increase in programming current through the RRAM 111, thereby increasing the conductivity of the PFET 701. The PFET 701 can subsequently be turned off and the feedback buffer circuit 120 connected to the bitline 101 can be turned back on, again biasing the bitline 101 to Vvg. This ensures that the voltage across the RRAM 111 is kept in a safe zone. The output voltage from the current-to-voltage converter 185 can further be monitored and digitized and a decision can be made with respect to the next steps. For example, either the control signal on the gate of PFET 701 can be lowered further to increase the conductivity of the RRAM 111 toward the desired resistance state or the programming cycle can be stopped (e.g., because the desired resistance state has been achieved).

Those skilled in the art will recognize that the programming of an RRAM can be accomplished using multiple techniques. The principles of RRAM programming are as follows: (1) the RRAM should be exposed to a sufficiently high voltage that will initiate or continue the formation of filaments and the initiation filament formation relies on an electric field (e-field) driven mechanism; (2) upon forming, it is hypothesized that a reduction in resistance will occur because of charged species "bumping" into atoms and moving them such that the conductivity is increased; and (3) the higher the available current during the above process, the lower the resistance will become (up to a limit). Various closed loop techniques could be employed to achieve resistance programming to a relatively high degree of accuracy.

Figure 8A:
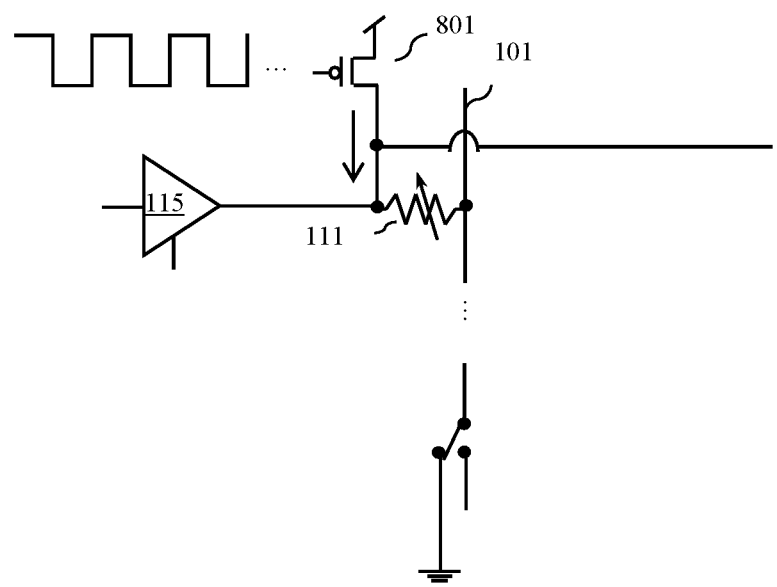
Figure 8B:
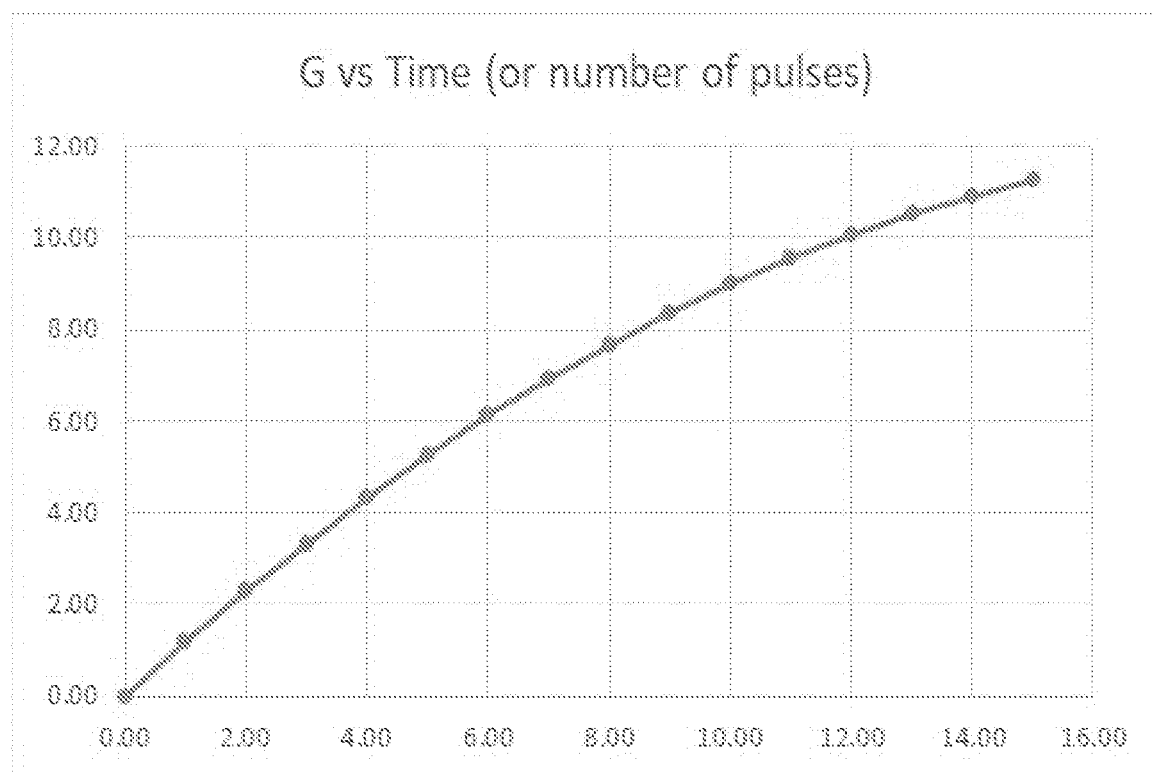

For example, FIG. 8A is a schematic diagram illustrating additional components that could be employed to implement one writing scheme in which conductance is increased by applying an increasing number of pulses to the gate of a single PFET current source. Specifically, referring to FIG. 8A in combination with any of FIGS. 1A-1D, a PFET 801 can be connected in series between a positive supply voltage (e.g., Vcc) and one terminal of the RRAM 111 and the opposite terminal can be connected via the bitline 101 and a switch to ground. A series of short duration pulses can be applied to the gate of the PFET 801. Each "0" pulse can provide a relatively large amount of current flow and can induce a sufficiently high voltage to start the filament formation process. As the number of pulses increases, so does the conductance, as shown in FIG. 8B. A feedback loop can be employed to measure the resulting resistance value after N number of pulses.

Figure 9A:
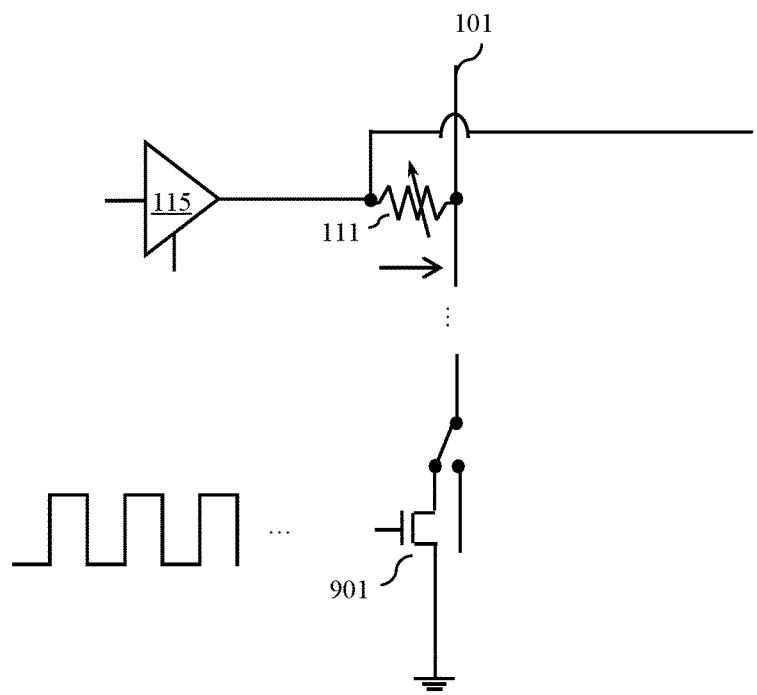
Figure 9B:
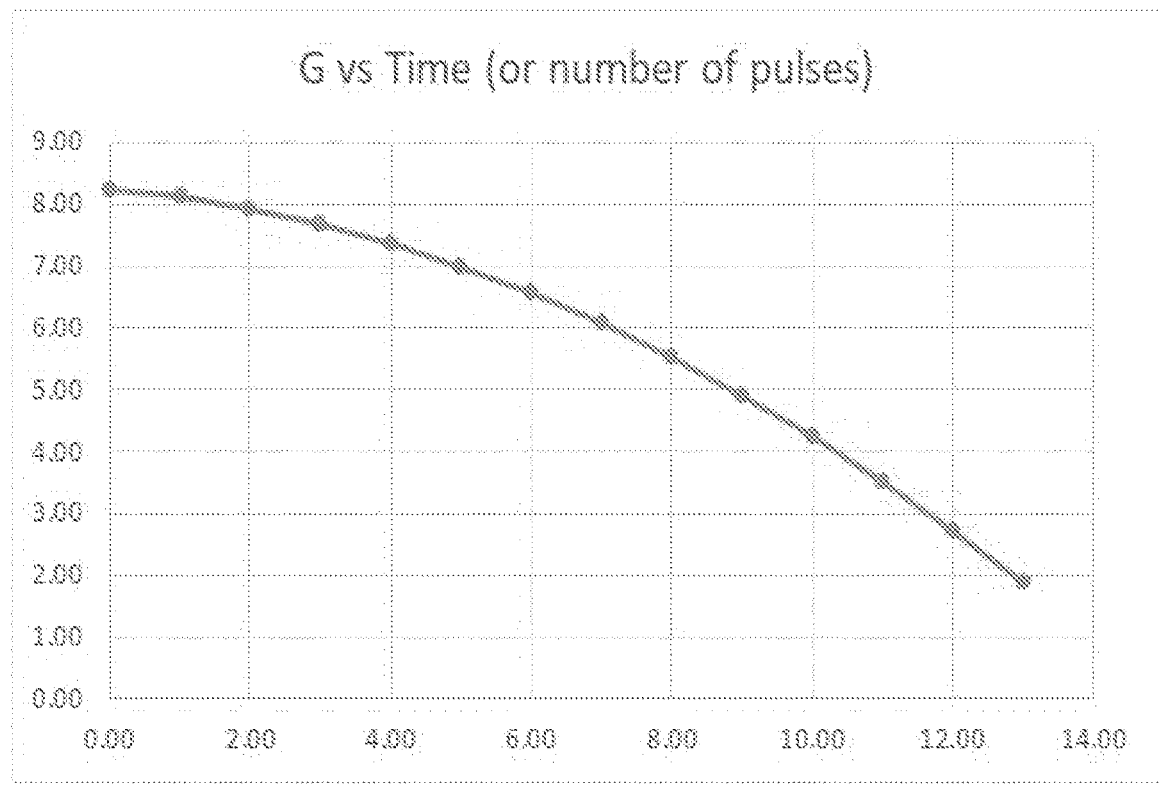

For example, FIG. 9A is a schematic diagram illustrating additional components that could be employed to implement one writing scheme in which conductance is decreased by applying an increasing number of pulses to the gate of single NFET current source. Specifically, referring to FIG. 9A in combination with any of FIGS. 1A-1D, an NFET 901 can be connected in series between one terminal of the RRAM 111 and ground (e.g., via a switch). A series of short duration pulses can be applied to the gate of the NFET 901. Each "1" pulse can provide a relatively large amount of current flow and can induce a sufficiently high voltage to start the filament breakdown process. As the number of pulses increases the conductance decreases, as shown in FIG. 9B. A feedback loop can be employed to measure the resulting resistance value after N number of pulses.

Figure 10A:
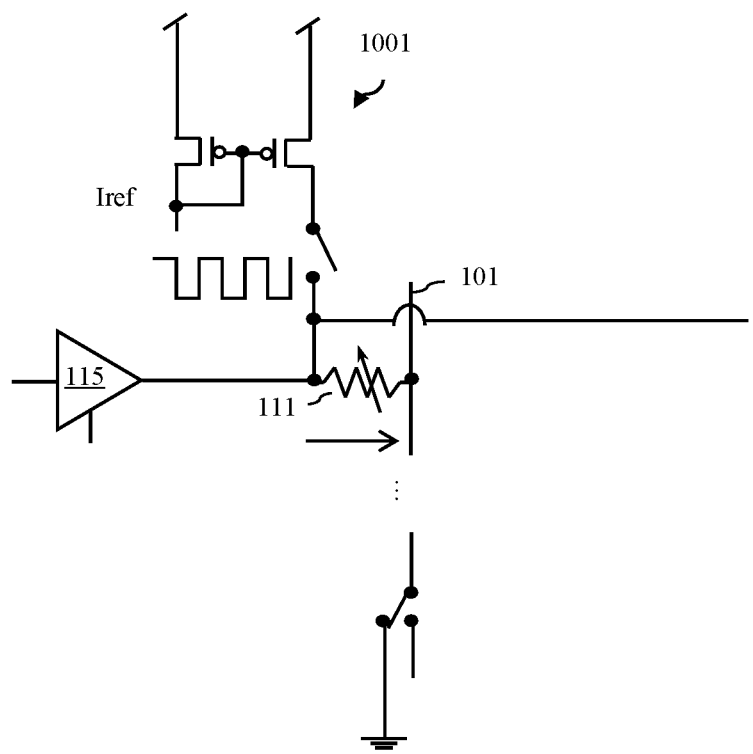
Figure 10B:
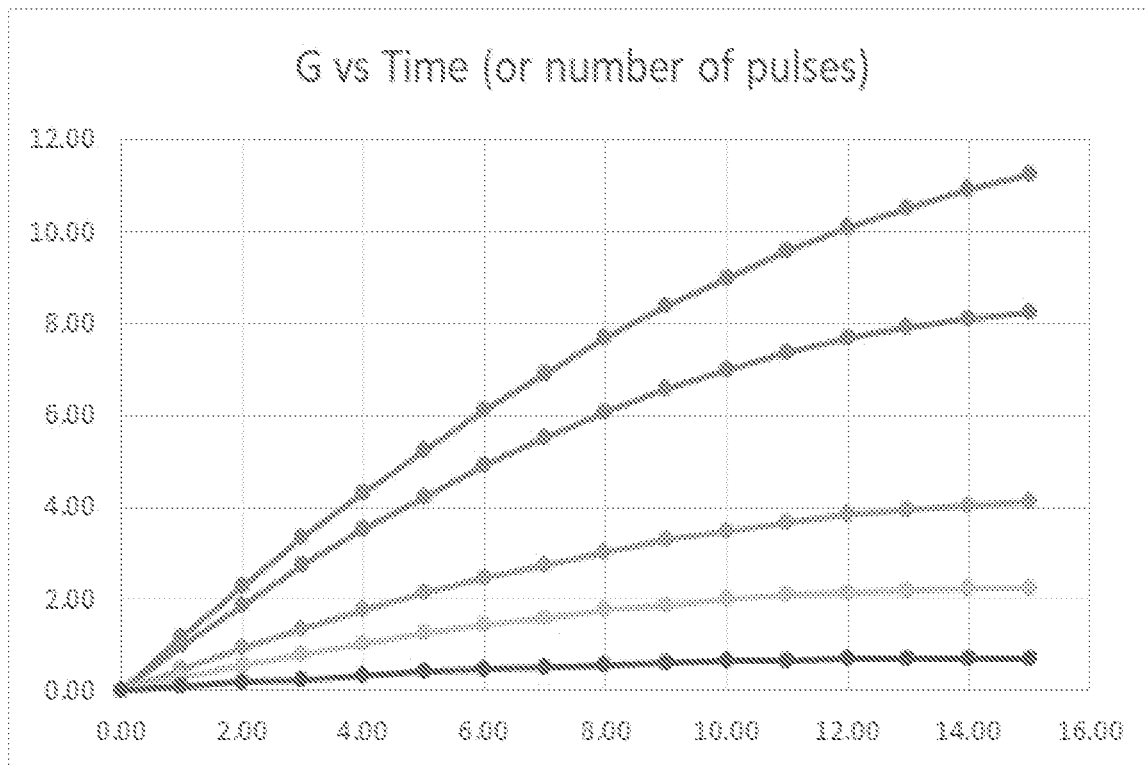

For example, FIG. 10A is a schematic diagram illustrating additional components that could be employed to implement one writing scheme in which conductance is increased using a current mirror-type current source connected to the RRAM by a pulsed switch in series. Specifically, referring to FIG. 10A in combination with any of FIGS. 1A-1D, a dual-PFET current mirror 1001 can have an output node connected by a first switch to one terminal of the RRAM 111 and the opposite terminal can be connected via the bitline 101 and a second switch to ground. A series of short duration pulses can be applied to open and close the switch to cause a relatively large amount of current flow and induce a sufficiently high voltage to start the filament formation process. As the number of pulses increases, so does the conductance, as shown in FIG. 10B. With this configuration Iref at the reference node of the current mirror 1001 can be varied (by various well-known mechanisms) to adjust the rate of conductance changes, also as shown in FFIG. 10B. A feedback loop can be employed to measure the resulting resistance value after N number of pulses.

Figure 11A:
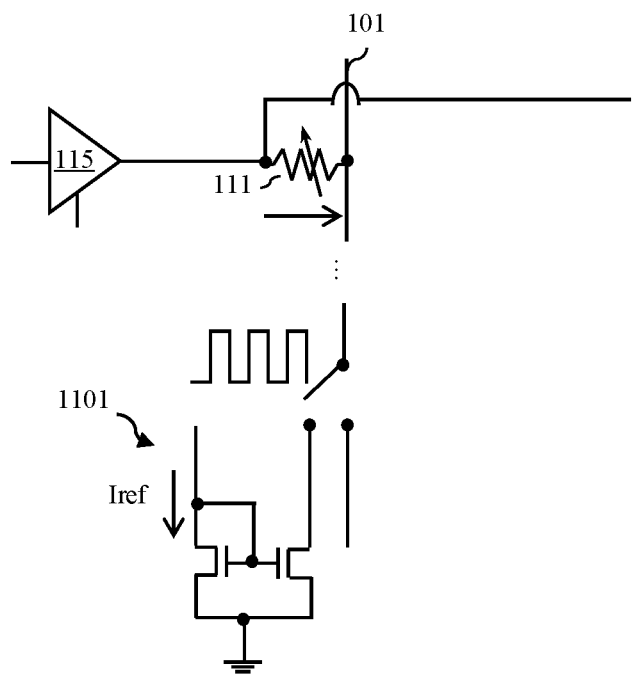
Figure 11B:
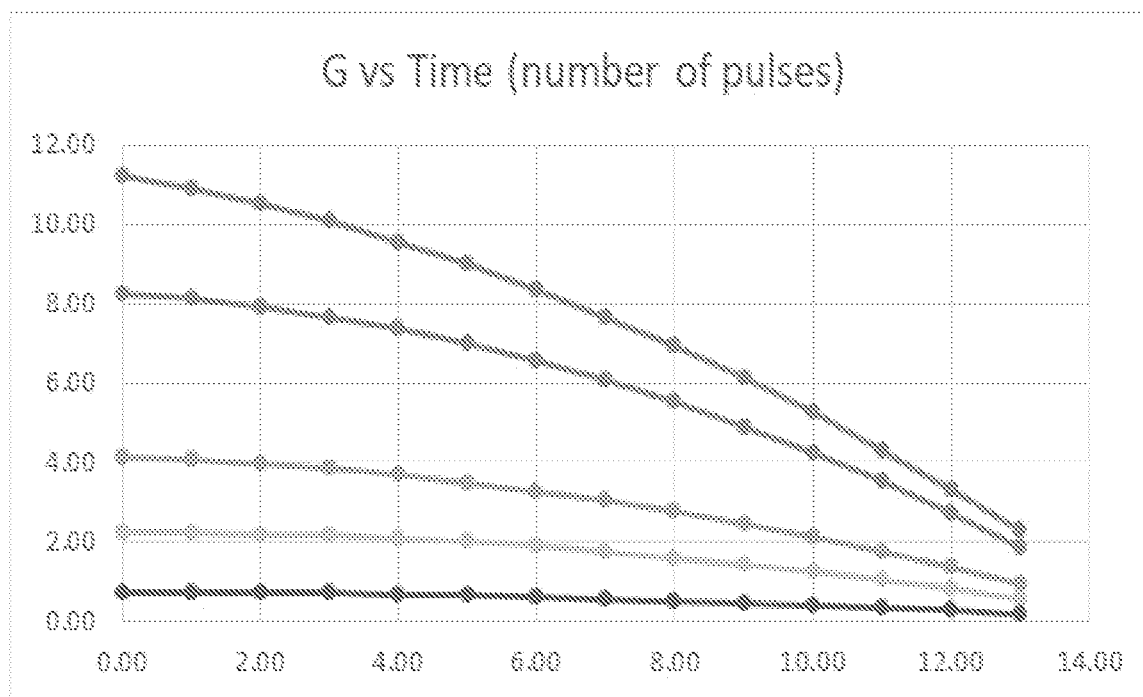

For example, FIG. 11A is a schematic diagram illustrating additional components that could be employed to implement one writing scheme in which conductance is decreased using a current mirror-type current source connected to the RRAM by a pulsed switch in series. Specifically, referring to FIG. 11A in combination with any of FIGS. 1A-1D, a dual-NFET current mirror 1101 can have an output node connected by a switch to one terminal of the RRAM 111. A series of very short duration pulses can be applied to open and close the switch to cause a relatively large amount of current flow and induce a sufficiently high voltage to start the filament breakdown process. As the number of pulses increases, the conductance decreases, as shown in FIG. 11B. With this configuration Iref at the reference node of the current mirror 1101 can be varied (by various well-known mechanisms) to adjust the rate of conductance changes, also as shown in FIG. 11B. A feedback loop can be employed to measure the resulting resistance value after N number of pulses.

Figure 12A:
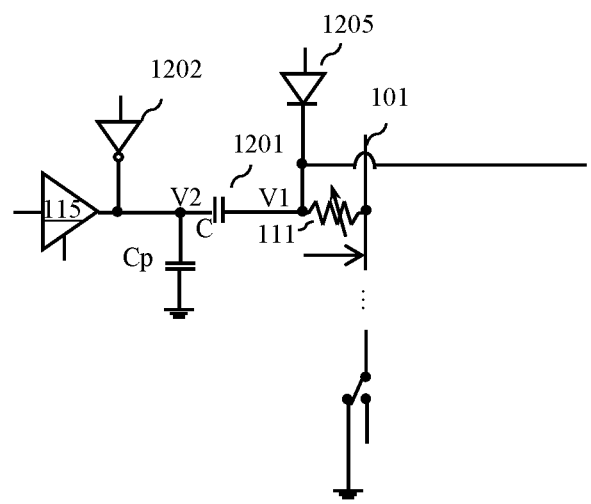
Figure 12B:
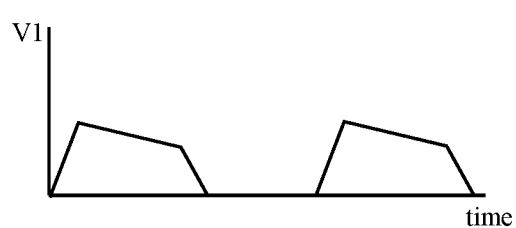
Figure 12C:
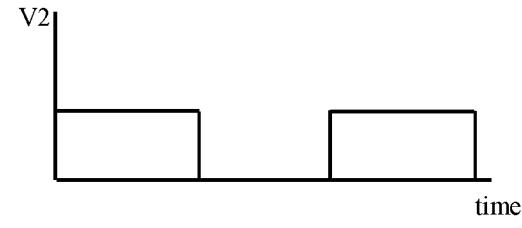
Figure 12D:
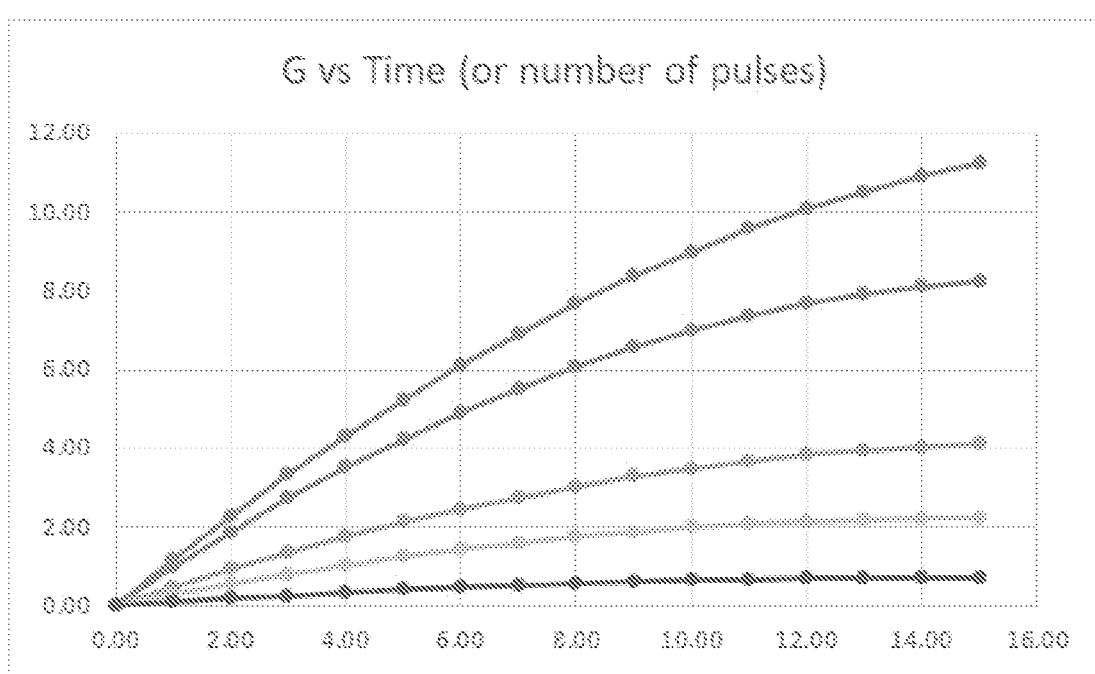

FIG. 12A is a schematic diagram illustrating additional components that could be employed to implement one writing scheme in which conductance is increased (i.e., resistance is decreased) using a capacitively coupled current pulse with a catch diode 1205 (e.g., a Schottky diode or any other suitable type of diode). Specifically, a capacitor 1201 can be connected in series between a driver 1202 (e.g., an inverter, as illustrated) and one terminal of the RRAM 111 and the opposite terminal of the RRAM 111 can be connected (e.g., by a switch) to ground. V1 can be a node between the capacitor 1201 and the RRAM 111 and V2 can be a node between the capacitor 1201 and the driver 1202. The catch diode 1205 can be connected to V1. FIG. 12B and FIG. 12C are graphs illustrating changes in V1 and V2, respectively, over time (t). The capacitor 1201 can deliver a peak current of C(dV/dt) and this peak current can decay through the RRAM 111. The value of the peak current can be adjusted by adjusting the value of the coupling capacitor 1201 or the delta-v. The output of the driver 1202 can be loaded with parasitic capacitance (Cp) to slow down the rise time (increase the dt). The current pulses into the RRAM 111 can be proportional to the rise time of V2 (Zout of the driver 1202 and the parasitic capacitance Cp). With this configuration, conductance of the RRAM 111 can be increased with the application of current pulses, as shown in FIG. 12D. It should be noted that the coupling capacitor 1201 can limit the total amount of charge dumped into the RRAM 111, thereby limiting the rate of change of the conductance. For example, with the configuration of FIG. 12A, during a write operation, nodes V1 and V2 can initially be held at ground. When the driver 1202 changes state, V2 can switch from ground to Vcc and current can flow through the capacitor 1201 and then the RRAM 111 to ground. This direction of current flow can cause a reduction in the resistance of the RRAM 111 and can pull V2 back down to ground. The catch diode 1205 can prevent node V1 from dropping below (VE-0.3V), thereby preventing any current from flowing in the RRAM 111 in the opposite direction. Thus, the catch diode 1205 can prevent the resistance of the RRAM 111 from increasing. Now, the resistance of the RRAM 111 can be adjusted downward in a unidirectional fashion (i.e., decreased) as a function of the number and magnitude of pulses. That is, the resistance of the RRAM can be reduced with each pulse and the per pulse rate of decrease will depend upon the magnitude of the pulses. In order words, with this configuration, the conductance of the RRAM can be increased with each pulse and the per pulse rate of increase will depend on the magnitude of the pulses.

Figure 13A:
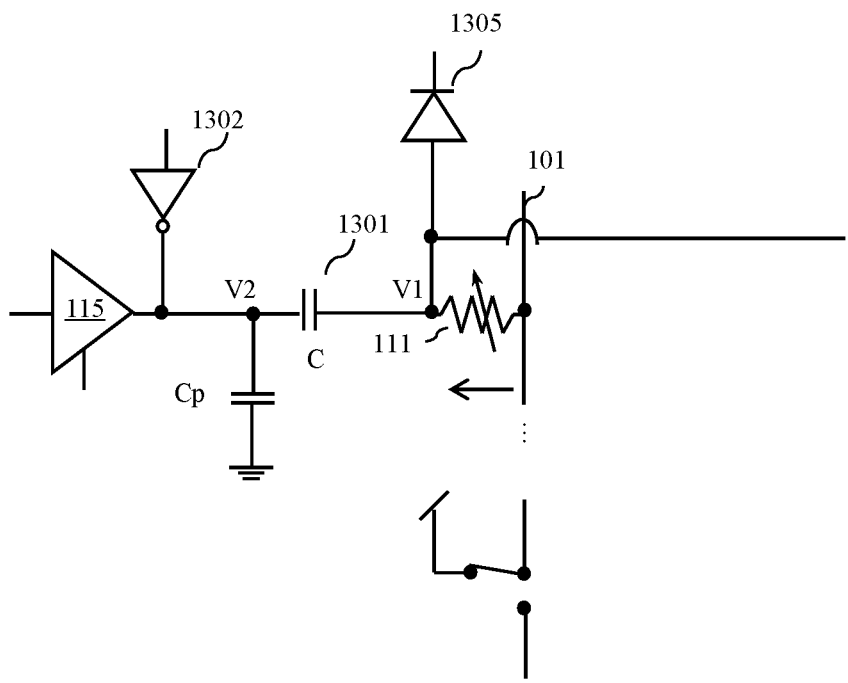
Figure 13B:
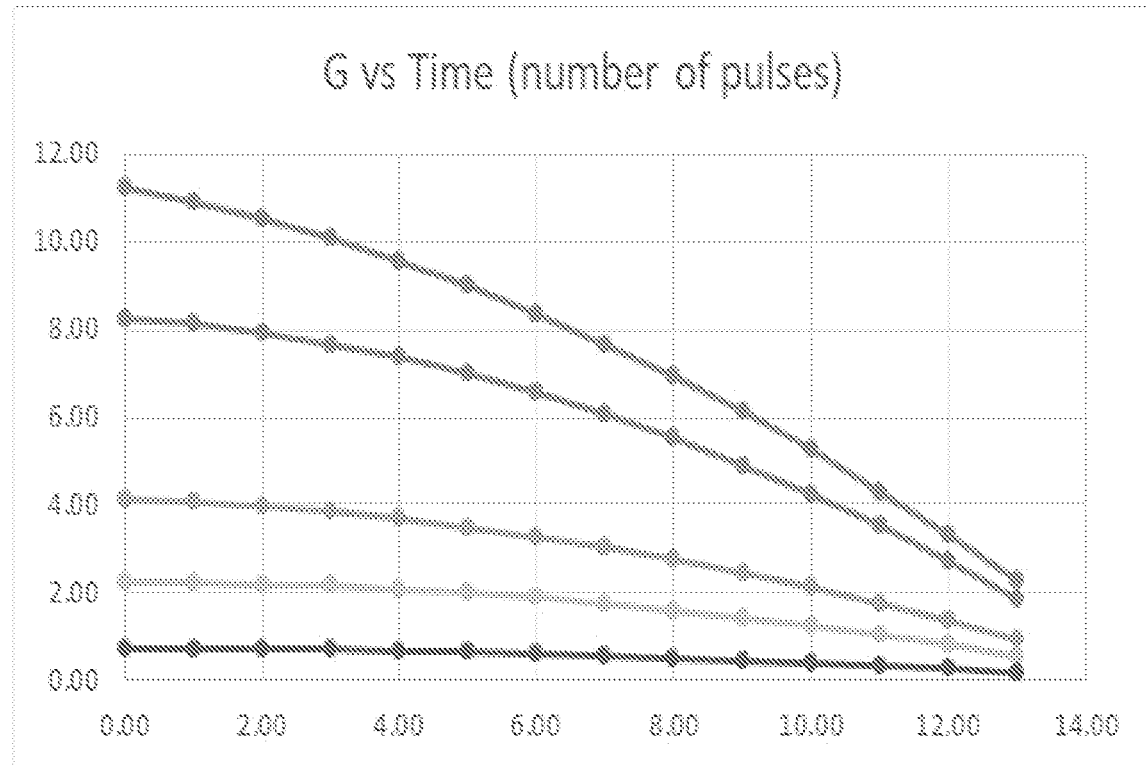

FIG. 13A is a schematic diagram illustrating additional components that could be employed to implement one writing scheme in which conductance is decreased (i.e., resistance is increased) using a capacitively coupled current pulse with a catch diode 1305 (e.g., a Schottky diode or any other suitable type of diode). Specifically, a capacitor 1301 can be connected in series between a driver 1302 (e.g., an inverter, as illustrated) and one terminal of the RRAM 111 and the opposite terminal of the RRAM 111 can be connected to Vcc. V1 can be a node between the capacitor 1301 and the RRAM 111 and V2 can be a node between the capacitor 1301 and the driver 1302. The catch diode 1305 can be connected to V1. The capacitor 1301 can deliver a peak current C(dV/dt) and this peak current can decay through the RRAM 111. The value of the peak current can be adjusted by adjusting the value of the coupling capacitor 1301 or the delta-v. The output of the driver 1302 can be loaded with parasitic capacitance (Cp) to slow down the rise time (increase the dt). The current pulses into the RRAM 111 can be proportional to the rise time of V2 (Zout of the driver 1302 and the parasitic capacitance Cp). With this configuration, the conductance of RRAM 111 can be decreased with the application of current pulses, as shown in FIG. 13B. For example, with the configuration of FIG. 13A, during a write operation, V1 and V2 can initially be set at Vcc. When the driver 1302 changes state, V2 can switch from Vcc to ground and current can flow through from the RRAM 111 and then through the capacitor 1301 to node V2. This direction of current flow can cause an increase in the resistance of the RRAM 111 and can pull V2 back up to Vcc. The catch diode 1305 can prevent node V1 from increasing above (VE+0.3V), thereby preventing any current from flowing through the RRAM 111 in the opposite direction. Thus, the catch diode 1305 can prevent the resistance of the RRAM 111 from decreasing. Now the resistance of RRAM 111 can be adjusted upward in unidirectional fashion (i.e., increased) as a function of the number and magnitude of pulses. That is, the resistance of the RRAM 111 can increase with each pulse and the per pulse rate of the increase will depend upon the magnitude of the pulses. In order words, the conductance of the RRAM will decrease with each pulse and the per pulse rate of the decrease will depend on the magnitude of the pulses.

Figure 14A:
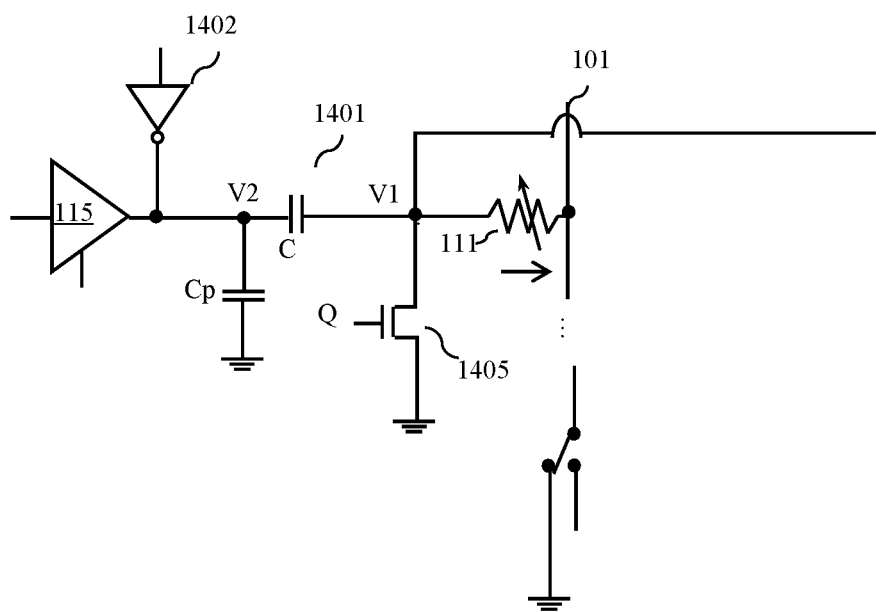
Figure 14B:
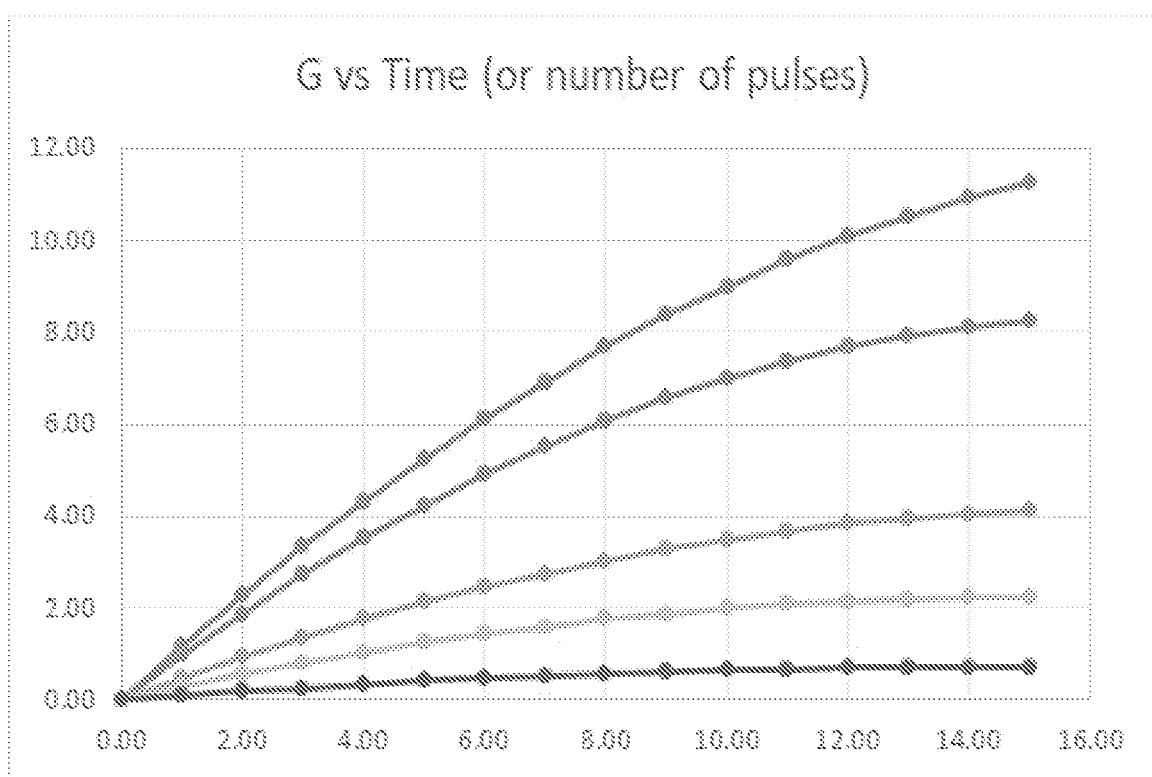

For example, FIG. 14A is a schematic diagram illustrating additional components that could be employed to implement one writing scheme in which conductance is increased using a capacitively coupled current pulse with a synchronous rectifier. Specifically, a capacitor 1401 can be connected in series between a driver 1402 (e.g., an inverter, as illustrated) and one terminal of the RRAM 111 and the opposite terminal of the RRAM 111 can be connected (e.g., by a switch) to ground. V1 can be a node between the capacitor 1401 and the RRAM 111 and V2 can be a node between the capacitor 1401 and the driver 1402. Additionally, an NFET 1405 can be connected in series between the node V1 and ground and can be controlled by a gate voltage (Q). The capacitor 1401 can deliver a peak current of C(dV/dt). This peak current can decay through the RRAM 111. The value of the peak current can be adjusted by adjusting the value of the coupling capacitor 1401 or the delta-v. The output of the driver 1402 can be loaded with parasitic capacitance (Cp) to slow down the rise time (increase the dt). With this configuration, the conductance of RRAM 111 can be increased with the application of current pulses, as shown in FIG. 14B. For example, with the configuration of FIG. 14A, V1 can initially be set at ground by switching Q to Vcc and V2 can also initially be set at ground. When the driver 1402 changes state, V2 can switch from ground to Vcc, thereby causing current to flow through capacitor 1401 and the RRAM 111 to ground. This direction of current flow can cause the resistance of RRAM 111 to be reduced and can pull V2 back down to ground. When V2 changes state from Vcc back to ground but the NFET 1405 is still turned on, node V1 will be clamped to ground and current flow through the RRAM 111 in the opposite direction is prevented. Thus, the NFET 1405 can be used to prevent any increase in the resistance of the RRAM 111. Now, the resistance of the RRAM 111 can be adjusted downward in a unidirectional fashion (i.e., decreased) as a function of the number and magnitude of pulses. That is, the resistance of the RRAM 111 can be reduced with each pulse and the per pulse rate of decrease will depend upon the magnitude of the pulses. In order words, with this configuration, the conductance of the RRAM 111 can be increased with each pulse and the per pulse rate of increase will depend on the magnitude of the pulses.

Figure 15A:
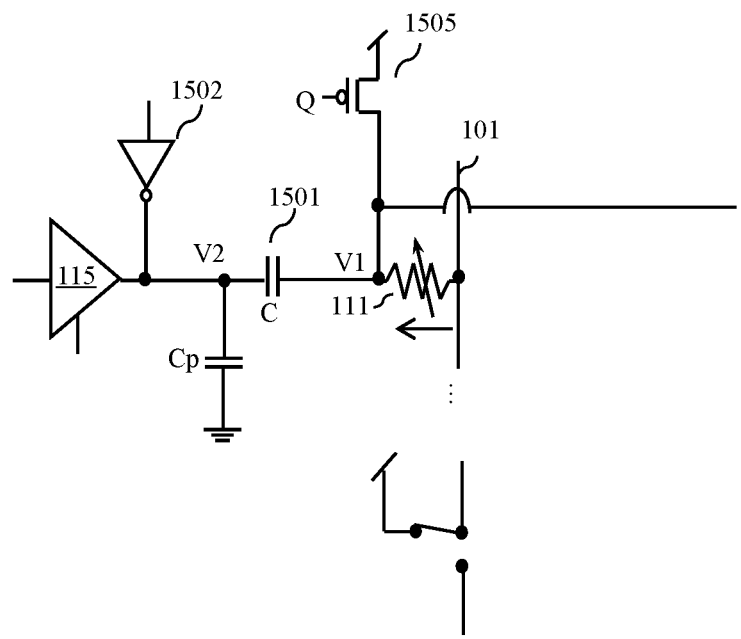
Figure 15B:
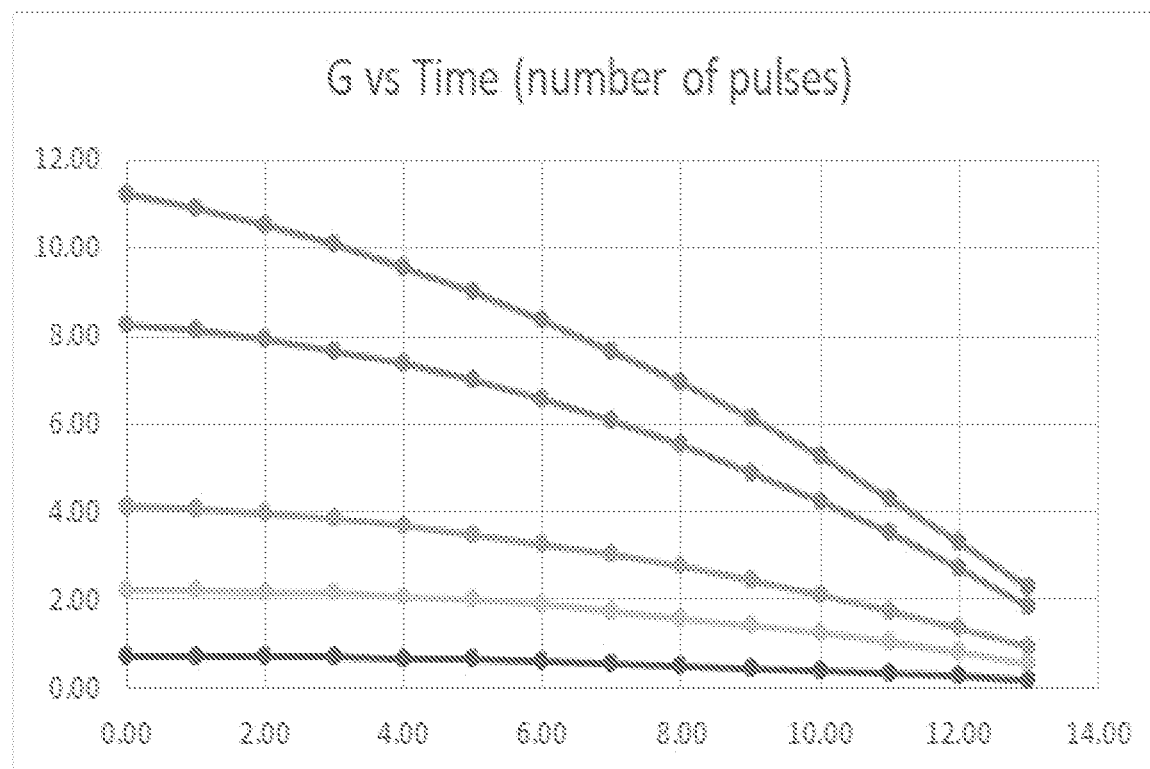

For example, FIG. 15A is a schematic diagram illustrating additional components that could be employed to implement one writing scheme in which conductance is decreased using a capacitively coupled current pulse with a synchronous rectifier. Specifically, a capacitor 1501 can be connected in series between a driver 1502 (e.g., an inverter, as illustrated) and one terminal of the RRAM 111 and the opposite terminal of the RRAM 111 can be connected (e.g., by a switch) to ground. V1 can be a node between the capacitor 1501 and the RRAM 111 and V2 can be a node between the capacitor 1501 and the driver 1502. Additionally, a PFET 1505 can be connected in series between the node V1 and Vcc and can be controlled by a gate voltage (Q). The capacitor 1501 can deliver a peak current of C(dV/dt). This peak current can decay through the RRAM 111. The value of the peak current can be adjusted by adjusting the value of the coupling capacitor 1501 or the delta-v. The output of the driver 1502 can be loaded with parasitic capacitance (Cp) to slow down the rise time (increase the dt). With this configuration, the conductance of RRAM 111 can be decreased with the application of current pulses, as shown in FIG. 15B. For example, with the configuration of FIG. 15A, V1 can initially be set at Vcc by switching Q to ground and Vcc can also initially be set at Vcc. When the driver 1502 changes state, V2 will switch from Vcc to ground, thereby causing the flow of current through the through the RRAM 111 and capacitor 1501. This direction of current flow can cause an increase in the resistance of the RRAM 111 and can pull V2 back up to Vcc. When V2 changes state from ground back to Vcc but the PFET 1505 is still turned on, node V1 will be clamped to Vcc and current flow through the RRAM 111 in the opposite direction is prevented. Thus, the PFET 1505 can be used to prevent any decrease in the resistance of the RRAM 111. Now, the resistance of the RRAM 111 can be adjusted upward in a unidirectional fashion (i.e., increased) as a function of the number and magnitude of pulses. That is, the resistance of the RRAM 111 can be increased with each pulse and the per pulse rate of increase will depend upon the magnitude of the pulses. In order words, with this configuration, the conductance of the RRAM 111 can be decreased with each pulse and the per pulse rate of increase will depend on the magnitude of the pulses.

Figure 16A:
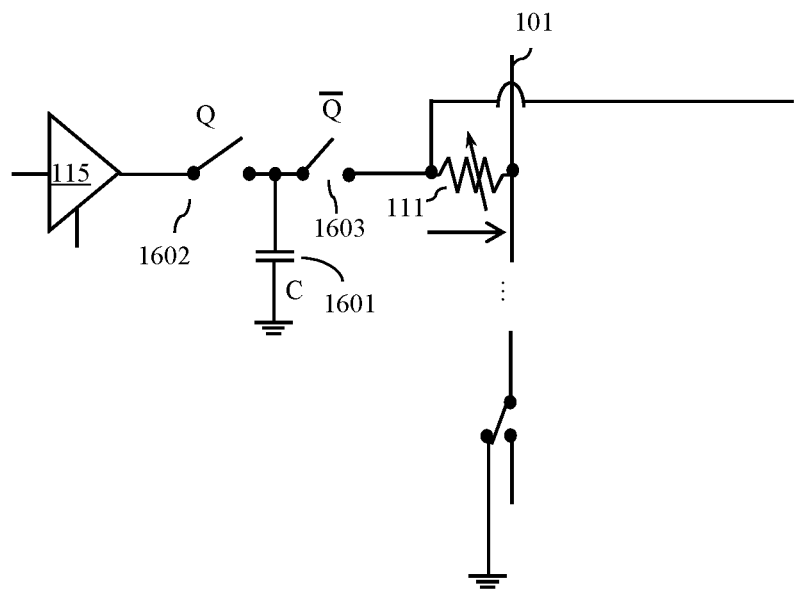
Figure 16B:
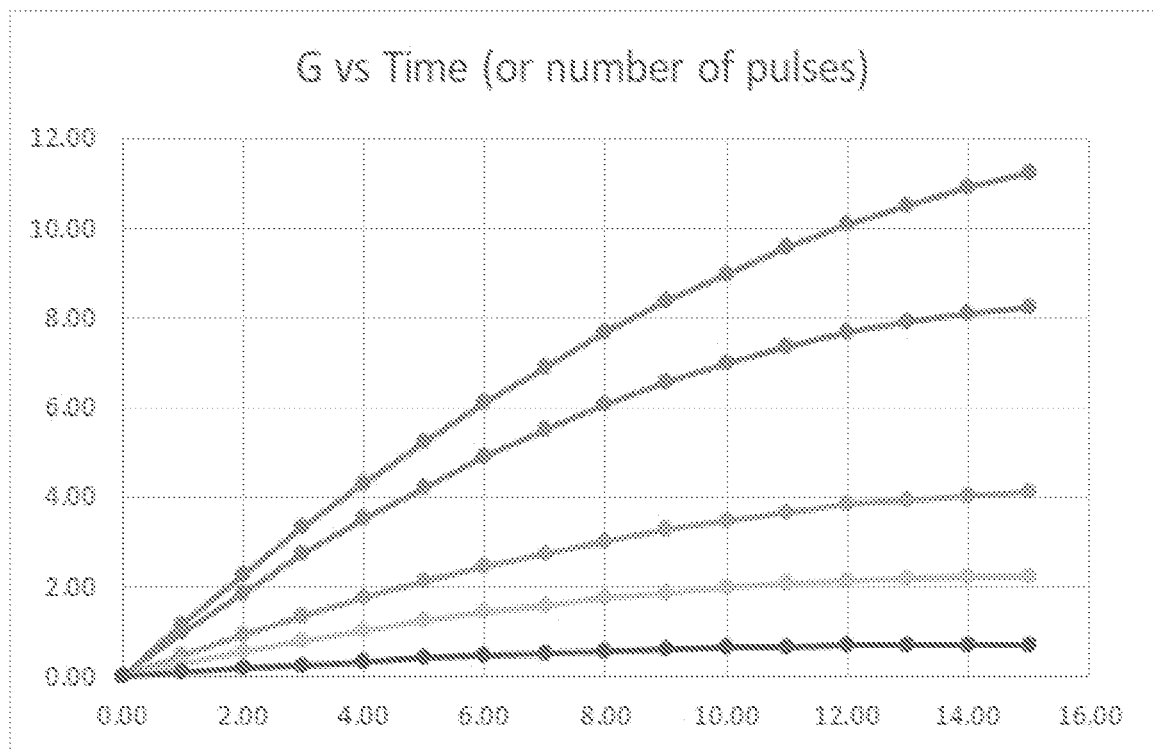

For example, FIG. 16A is a schematic diagram illustrating additional components that could be employed to implement one writing scheme in which conductance is increased using a capacitor reservoir for generating the pulsed current. Specifically, a pair of switches 1602 and 1603 (e.g., NFET switches), which are controlled by control signals Q and Qbar, respectively, can be series-connected between the output of the amplifier 115 and one terminal of the RRAM 111 and the opposite terminal can be connected to ground (e.g., via another switch). Additionally, a reservoir capacitor 1601 can be connected between an intermediate node (which is at the interface between the switches 1602-1603) and ground such that it is connected in parallel with the RRAM 111. The max voltage on the RRAM 111 can be controlled to deliver "programmable" amounts of charge and peak current thereto. The capacitance (C) of the capacitor 1601 can be varied for programmable charge packets. Vcc can also be varied for a programmable peak current and programmable charge packets. The current pulses into the RRAM 111 will be proportional to Vcc, which can be adjusted to a lower value over time. The reservoir capacitor 1601 will limit the total amount of current flow into RRAM 111 for any given pulse. With this configuration, conductance of RRAM 111 can be increased with the application of current pulses, as shown in FIG. 16B. For example, with the configuration of FIG. 16A, C of the capacitor 1601 can initially be charged to Vcc, Q can be high and Qbar can be low. Thus, the voltage across the RRAM can be at ground because the switch 1603 is open. Q can then go low and Qbar can go high such that the capacitor 1601 is disconnected from Vcc and instead connected to the RRAM 111, thereby causing current to flow from the capacitor 1601 through the RRAM 111 to ground. This direction of current flow can cause the resistance of RRAM 111 to be reduced. The cycle can be repeated. That is, Q can go high and Qbar can go low, disconnecting the capacitor 1601 from the RRAM 111 and connecting it to Vcc for charging and so on. The more times the cycle is repeated, the more the resistance of the RRAM is reduced (i.e., the conductance of the RRAM 111 is increased).

Figure 17A:
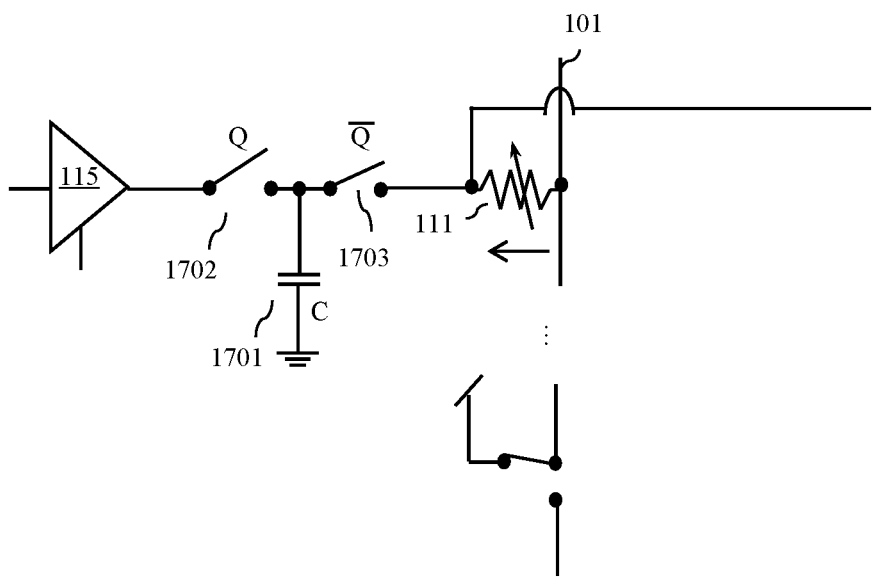
Figure 17B:
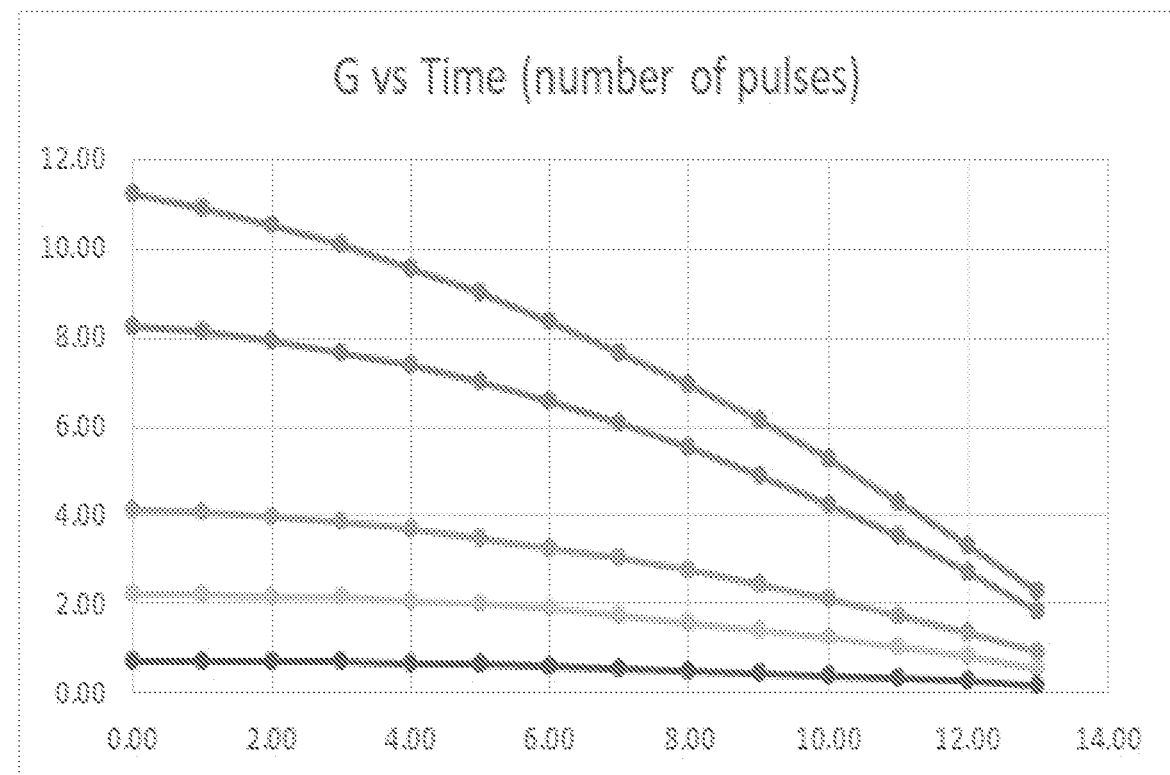

For example, FIG. 17A is a schematic diagram illustrating additional components that could be employed to implement one writing scheme in which conductance is decreased using a capacitor reservoir for generating the pulsed current. Specifically, a pair of switches 1702 and 1703 (e.g., NFET switches), which are controlled by control signals Q and Qbar, respectively, can be series-connected between the output of the amplifier 115 and one terminal of the RRAM 111 and the opposite terminal can be connected to Vcc (e.g., via another switch). Additionally, a reservoir capacitor 1701 can be connected between an intermediate node (which is at the interface between the switches 1702-1703) and ground such that it is connected in parallel with the RRAM 111. The max voltage on the RRAM 111 can be controlled to deliver "programmable" amounts of charge and peak current thereto. The capacitance (C) of the capacitor 1701 can be varied for programmable charge packets. Vcc can also be varied for a programmable peak current and programmable charge packets. The current pulses into the RRAM 111 will be proportional to Vcc, which can be adjusted to a lower value over time. The reservoir capacitor 1701 will limit the total amount of current flow into RRAM 111 for any given pulse. With this configuration, conductance of RRAM 111 can be decreased with the application of current pulses, as shown in FIG. 17B. For example, with the configuration of FIG. 17A, C of the capacitor 1701 can initially be charged to Vee (i.e., a low voltage), Q is high and Qbar is low such that the switch 1703 is open. Thus, the voltage across the RRAM is Vcc. Q can then go low and Qbar can go high such that the capacitor 1701 is disconnected from Vee and instead connected to the RRAM 111, thereby causing current to flow from Vcc through the RRAM 111 to the capacitor 1701 (which is charged to Vee). This direction of current flow can cause the resistance of RRAM 111 to be increased. The cycle can be repeated. That is, Q can go high and Qbar can go low, disconnecting the capacitor 1701 from the RRAM 111 and connecting it to Vee for charging and so on. The more times the cycle is repeated, the more the resistance of the RRAM is increased (i.e., the conductance of the RRAM 111 is decreased).

Figure 18:
FIG. 18 is a schematic diagram illustrating current reversal switches that could be incorporated into the disclosed structure.
Figure 19:
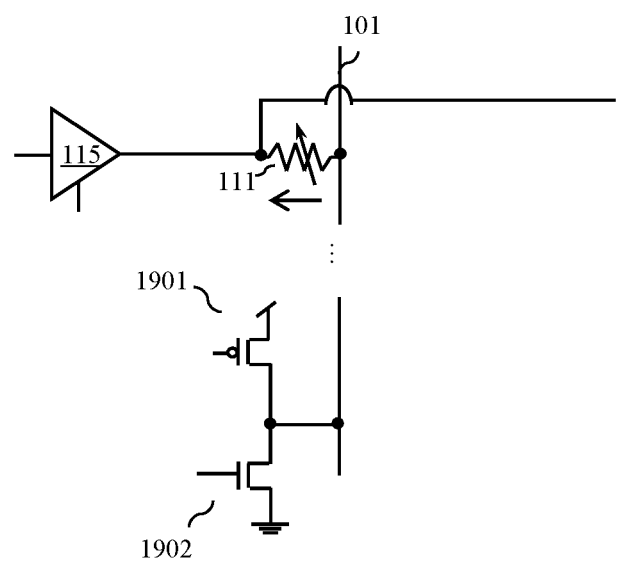
FIG. 19 is a schematic diagram illustrating additional components that could be incorporated into the disclosed structure to implement both a writing and an erasing scheme.

It should be noted that additional components can be employed in the structure 100A-100D to facilitate reversing the programming of each programmable resistor 111-112 in each memory element 110. For example, as illustrated in FIG. 18, each RRAM can have an asymmetric physical structure with different top and bottom electrodes (as indicated by the dot on one terminal) and these terminals can be selectively connected by switches to different ones of the same two nodes (e.g., node VA and node VB). If the process flow used to increase the conductance has "overshot" the target conductance, then the direction of current flow can be switched by switching the node connections of the RRAM terminals. In any of the programming structures shown in FIGS. 7-17A described above switches can be placed at the different terminals to allow for the reversal of current flow, as illustrated in FIG. 18. Additional components can also be employed in the structure 100A-100D to facilitate erasing prior programming of each programmable resistor in each memory element 110. For example, FIG. 19 is a schematic diagram illustrating additional components that could be employed to implement both a writing and an erasing scheme. Referring to FIG. 19 in combination with any of FIGS. 1A-1D, a weak PFET 1901 can have a source region connected to a positive supply voltage (e.g., Vcc) and a drain region connected to a programming node on a bitline 101 (e.g., in the same manner as in FIG. 7 discussed above). An NFET 1902 can further be connected in series between the same programming node and ground. During a write mode, the feedback buffer circuit 120 connected to the bitline 101 can be switched off, the NFET 1902 can be off, and the output of the amplifier 115 can be switched to a low value. The gate of the PFET 1901 can be controlled by a write control signal that is lowered (e.g., by a control signal from a controller, not shown) in small increments to increase the conductivity of the PFET 1901. As the PFET 1901 gradually turns on, there will be a corresponding increase in programming current through the RRAM 111, thereby increasing the conductivity of the PFET 1901. The PFET 1901 can subsequently be turned off and the feedback buffer circuit 120 can be turned back on, again biasing the bitline 101 to Vvg. During the erase mode, the output of the amplifier 115 can be switched to high and the NFET 1902 can be turned on. Such an erase process, like the write process, can be performed on one programmable resistor of a memory element at a time. Alternatively, all programmable resistors in a memory bank, all programmable resistors in a column of memory banks, or all programmable resistors in the memory bank array could be concurrently erased.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises", "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
an array of memory banks arranged in rows and columns, wherein each memory bank comprises:
input nodes;
a bitline;
an output node;
memory elements connected to the input nodes, respectively, wherein each memory element comprises a programmable resistor connected between a corresponding input node and the bitline; and
a feedback buffer circuit connected to the bitline and the output node; and
column interconnect lines for the columns, respectively, wherein each column interconnect line for each column is connected to all output nodes of all memory banks in the column.

2. The structure of claim 1, wherein, within each memory element, the programmable resistor is programmable to any of multiple different resistance states to store a weight value as a function of a programmed resistance state.

3. The structure of claim 1,
wherein each memory bank further comprises:
a bias node on the bitline,
wherein the feedback buffer circuit is connected to the bias node, biases the bias node to a virtual ground voltage and outputs, at the output node, a buffered bank-specific output current dependent on a sum of all output currents from all programmable resistors of the memory elements in the memory bank, and
wherein each column interconnect line for each column receives and sums all buffered bank-specific output currents from all memory banks in the column.

4. The structure of claim 3, further comprising current-to-voltage converters for the columns, respectively,
wherein each current-to-voltage converter for each column is connected to the column interconnect line for the column, receives, from the column interconnect line for the column, a column-specific output current equal to a sum of the buffered bank-specific output currents from the memory banks in the column, and outputs a column-specific analog output voltage based on the column-specific output current.

5. The structure of claim 4, wherein the column-specific analog output voltage represents a solution for a dot product computation.

6. The structure of claim 1,
wherein each initial memory bank within each row comprises amplifiers, and
wherein each amplifier adds a virtual ground voltage to an input voltage and outputs, to the programmable resistor, a level shifted input voltage equal to a sum of the input voltage and the virtual ground voltage.

7. The structure of claim 6, wherein each initial memory bank within each row further comprises multiplexors connected to inputs of the amplifiers.

8. The structure of claim 6, further comprising sets of row interconnect lines interconnecting adjacent memory banks within each row, wherein any given row interconnect line connects an input terminal of one programmable resistor of one memory element at a particular bank row address in an upstream memory bank to another memory element at the particular bank row address in an adjacent downstream memory bank.

9. The structure of claim 1, wherein the programmable resistor of each memory element comprises any of a resistive random access memory-type resistor, a phase change memory-type resistor, and a magnetic tunnel junction-type resistor.

10. The structure of claim 1, wherein the programmable resistor of each memory element comprises a resistive random access memory-type resistor with more than two different resistance states.

11. A structure comprising:
an array of memory banks arranged in rows and columns, wherein each memory bank comprises:
input nodes;
an output node;
a bitline comprising a bias node;
memory elements, wherein a memory element comprises a programmable resistor connected between a corresponding input node and the bitline; and
a feedback buffer circuit connected to the bias node and the output node; and
column interconnect lines for the columns, respectively, wherein a column interconnect line for a column connects all output nodes of all memory banks in the column;
sets of row interconnect lines interconnecting adjacent memory banks within each row and communicating level shifted input voltages from memory bank to memory bank within the rows; and
voltage buffers integrated into at least some of the memory banks to buffer the level shifted input voltages.

12. The structure of claim 11, wherein, within the memory element, the programmable resistor is programmable to any of multiple different resistance states to store a weight value as a function of a programmed resistance state.

13. The structure of claim 11,
wherein, within the memory bank, the feedback buffer circuit biases the bias node to a virtual ground voltage and outputs, at the output node of the memory bank, a buffered bank-specific output current dependent on a sum of all output currents from all programmable resistors of the memory elements in the memory bank, and
wherein a column interconnect lines for a column is connected to all output nodes of all memory banks in the column and receives and sums all buffered bank-specific output currents from all memory banks in the column.

14. The structure of claim 13, further comprising current-to-voltage converters for the columns, respectively, wherein each current-to-voltage converter for each column is connected to the column interconnect line for the column, receives, from the column interconnect line for the column, a column-specific output current equal to a sum of the buffered bank-specific output currents from the memory banks in the column, and outputs a column-specific analog output voltage based on a the column-specific output current.

15. The structure of claim 14, wherein the column-specific analog output voltage represents a solution for a dot product computation.

16. The structure of claim 11,
wherein each initial memory bank within each row comprises amplifiers, and
wherein each amplifier adds a virtual ground voltage to an input voltage and outputs, to the programmable resistor, a level shifted input voltage equal to a sum of the input voltage and the virtual ground voltage.

17. The structure of claim 16, wherein each initial memory bank within each row further comprises multiplexors connected to inputs of the amplifiers.

18. The structure of claim 16, wherein any given row interconnect line connects an input terminal of one programmable resistor of one memory element at a particular bank row address in an upstream memory bank to another memory element at the particular bank row address in an adjacent downstream memory bank.

19. The structure of claim 11, wherein the programmable resistor of each memory element comprises any of a resistive random access memory-type resistor, a phase change memory-type resistor, and a magnetic tunnel junction-type resistor.

20. A structure comprising:
an array of memory banks arranged in rows and columns, wherein each memory bank comprises:
input nodes;
an output node;
a bitline comprising a bias node;
memory elements, wherein each memory element comprises a resistive random access memory-type programmable resistor connected between a corresponding input node and the bitline; and
a feedback buffer circuit connected to the bias node and the output node; and
column interconnect lines for the columns, respectively, wherein each column interconnect line for each column is connected to all output nodes of all memory banks in the column.

* * * * *